United States Patent
McCracken et al.

(10) Patent No.: US 9,184,909 B1
(45) Date of Patent: Nov. 10, 2015

(54) APPARATUS AND METHODS FOR CLOCK AND DATA RECOVERY

(71) Applicant: Analog Devices, Inc., Norwood, MA (US)

(72) Inventors: Stuart McCracken, Arlington, MA (US); John Kenney, West Windsor, NJ (US); Kimo Tam, Lincoln, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/594,472

(22) Filed: Jan. 12, 2015

(51) Int. Cl.
*H04L 7/04* (2006.01)
*H04L 7/00* (2006.01)
*H04L 7/02* (2006.01)

(52) U.S. Cl.
CPC ............... *H04L 7/042* (2013.01); *H04L 7/002* (2013.01); *H04L 7/0033* (2013.01); *H04L 7/02* (2013.01)

(58) Field of Classification Search
CPC ....... H03L 7/091; H03L 7/07; G06F 13/4291; H04L 7/042
See application file for complete search history.

(56) References Cited

U.S. PATENT DOCUMENTS

| | | | |
|---|---|---|---|
| 7,099,424 B1 * | 8/2006 | Chang et al. | 375/370 |
| 2006/0224339 A1 * | 10/2006 | Kim et al. | 702/66 |

OTHER PUBLICATIONS

M. Mansuri et al., "A Scalable 0.128-1 Tb/s, 0.8-2.6 pJ/bit, 64-Lane Parallel I/O in 32-nm CMOS," IEEE Journal of Solid-State Circuits, vol. 48, No. 12, pp. 3229-3242, Dec. 2013.
M. Mansuri et al., "A scalable 0.128-to-1Tb/s 0.8-to-2.6pJ/b 64-lane parallel I/O in 32nm CMOS," ISSCC, 2013 IEEE International, Feb. 2013, 3 pages.
J. Sonntag and J. Stonick, "A Digital Clock and Data Recovery Architecture for Multi-Gigabit/s Binary Links," IEEE Journal of Solid-State Circuits, vol. 41, No. 8, pp. 1867-1875, Aug. 2006.
G. Miao et al., "A Fully-Integrated 10.5 to 13.5 Gbps Transceiver in 0.13mm CMOS," in the Proc. of the Custom Integrated Circuits Conference, pp. 595-598, 2003.

* cited by examiner

*Primary Examiner* — Curtis Odom
(74) *Attorney, Agent, or Firm* — Knobbe Martens Olson & Bear LLP

(57) ABSTRACT

Apparatus and methods for clock and data recovery (CDR) are provided herein. In certain configurations, a first CDR circuit captures data and edge samples from a first input data stream received over a first lane. The data and edge samples are used to generate a master phase signal, which is used to control a phase of a first data sampling clock signal used for capturing the data samples. Additionally, the first CDR circuit generates a master phase error signal based on changes to the master phase signal over time, and forwards the master phase error signal to at least a second CDR circuit. The second CDR circuit processes the master phase error signal to generate a slave phase signal used to control a phase of a second data sampling clock signal used for capturing data samples from a second input data stream received over a second lane.

31 Claims, 13 Drawing Sheets

APPARATUS AND METHODS FOR CLOCK AND DATA RECOVERY

BACKGROUND

1. Field

Embodiments of the invention relate to electronic devices, and more particularly, to clock and data recovery circuits.

2. Description of the Related Technology

Clock and data recovery (CDR) circuits can be used in a variety of applications for recovering data from a high-speed serial data stream.

For example, a chip-to-chip communication system can include two or more serial communication links or lanes used to communicate data from a first integrated circuit (IC) or chip to a second IC. Additionally, each lane can include a CDR circuit for recovering data from an input data stream received over the lane. By communicating data in parallel across two or more lanes, the chip-to-chip communication system can exhibit a higher overall data rate relative to a configuration using a single lane.

SUMMARY

In one aspect, a clock and data recovery (CDR) system is provided. The CDR system includes a first CDR circuit and a second CDR circuit. The first CDR circuit is configured to receive a first input data stream, and to generate a master phase signal based on tracking the first input data stream. The first CDR circuit is further configured to generate a master phase error signal based on a change to the master phase signal over time. The second CDR circuit is configured to receive a second input data stream. The second CDR circuit is further configured to receive the master phase error signal from the first CDR circuit and to generate a first slave phase signal based on the master phase error signal. The second CDR circuit is further configured to track the second input data stream based on the first slave phase signal.

In another aspect, a method of clock and data recovery (CDR) is provided. The method includes generating a master phase signal based on tracking a first input data stream using a first CDR circuit, generating a master phase error signal based on a change to the master phase signal over time, generating a first slave phase signal based on the master phase error signal, and tracking a second input data stream based on the first slave phase signal using a second CDR circuit.

In another aspect, a clock and data recovery (CDR) system includes a first CDR circuit and a second CDR circuit. The first CDR circuit is configured to receive a first input data stream, and includes a means for generating a master phase signal based on tracking the first input data stream and a means for generating a master phase error signal. The second CDR circuit is configured to receive a second input data stream and the master phase error signal, and includes a means for tracking the second input data stream based on the first slave phase signal.

DETAILED DESCRIPTION OF EMBODIMENTS

Figure 1:
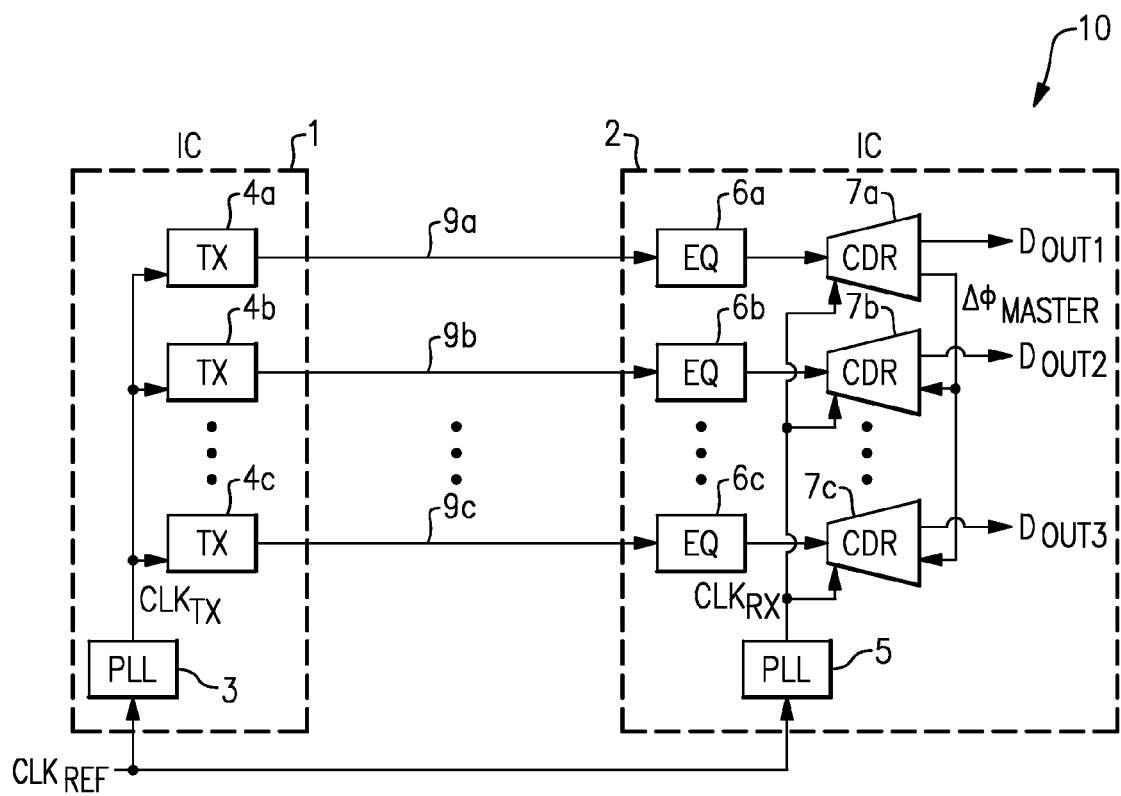
FIG. 1 is a schematic diagram of one embodiment of a chip-to-chip communication system.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Apparatus and methods for clock and data recovery (CDR) are provided herein. In certain configurations, a chip-to-chip communication system includes two or more CDR circuits that recover data from two or more serial data communication links or lanes. A first CDR circuit receives a first input data stream from a first lane, and captures data samples and edge samples from the first input data stream. The data samples and edge samples are used to generate a master phase signal, which the first CDR circuit uses to control a phase of a data sampling clock signal used for capturing the data samples from the first input data stream. Additionally, the first CDR circuit generates a master phase error signal based on changes to the master phase signal over time, and the first CDR circuit forwards the master phase error signal to at least a second CDR circuit. The second CDR circuit processes the master phase error signal to generate a slave phase signal that is used to control a phase of a data sampling clock signal used for capturing data samples from a second input data stream received over a second lane.

By forwarding the master phase error signal from a master CDR circuit to one or more slave CDR circuits, the power consumption of the chip-to-chip communication system can be reduced. For example, when the master phase error signal is used to generate a slave phase signal of a slave CDR circuit, edge sampling and/or delay-locked loop circuitry of the slave CDR circuit can be powered off to reduce power consumption.

In certain configurations, the master phase error signal can be encoded using a phase difference encoder. Additionally, the encoded master phase error signal can be sent to one or more slave CDR circuits that include a phase difference decoder for decoding the encoded master phase error signal. By using an encoding scheme, a timing constraint between a master CDR circuit and a slave CDR circuit can be relaxed or eliminated.

The master CDR circuit and one or more slave CDR circuits can operate in parallel to track incoming data received on the lanes. In certain embodiments, the lanes each carry distinct data and none are redundant versions of another lane. Random jitter among the lanes can be correlated, which permits the slave CDR circuits to track phase changes in the master CDR circuit while maintaining lock with received input data streams. In certain implementations, the correlation in jitter can arise from a common jitter source, such as a clock multiplier unit that generates reference clock signals for both circuitry that transmits data on the lanes and for CDR circuits that recover data from the lanes. In certain configurations, a slave CDR circuit can include a jitter coherence determination circuit to determine whether or not the jitter between a master CDR circuit and the slave CDR circuit is coherent. Additionally, when the jitter is determined to be incoherent, the slave CDR circuit can recover incoming data using separate phase information from the master CDR circuit.

To enhance robustness of data tracking, the slave CDR circuits can operate with a phase offset relative to the master phase signal. The phase offset can be separately selected for each slave CDR circuit to enhance data tracking performance. Additionally, in certain configurations, the phase offset can be regularly calibrated or updated to prevent the slave CDR circuit from losing lock in the presence of phase drift. For example, two or more CDR circuits can employ a token passing scheme to control timing of phase offset calibrations. When a particular slave CDR circuit holds the token, the slave CDR circuit can track incoming data using separate phase information from the master CDR circuit and can observe a difference between the local phase information and the master phase information to calibrate the slave CDR circuit's phase offset.

FIG. 1 is a schematic diagram of one embodiment of a chip-to-chip communication system 10. The chip-to-chip communication system 10 includes a first integrated circuit (IC) or chip 1 and a second IC 2. The chip-to-chip communication system 10 illustrates one example of a chip-to-chip communication system in accordance with the teachings herein.

A chip-to-chip communication system can use two or more serial communication links or lanes to increase an overall data rate. For example, a chip-to-chip communication system that includes 8 lanes that each operate at 12.5 Gb/s can have an overall data rate of about 100 Gb/s.

In the illustrated configuration, the chip-to-chip communication system 10 includes a first lane 9a, a second lane 9b, and a third lane 9c. Although the chip-to-chip communication system 10 is illustrated as including three lanes, the chip-to-chip communication system 10 can include more or fewer lanes. For example, in one embodiment, the chip-to-chip communication system 10 includes between 2 and 8 lanes.

Aggregate data rates between ICs of a chip-to-chip communication system can be relatively high. For example, a chip-to-chip communication system may operate at 100 Gb/s or more. In high speed chip-to-chip communication systems, it can be desirable to lower power consumption to decrease heat dissipation and/or increase the range of temperatures that the ICs can operate over.

In the illustrated configuration, the first IC 1 includes a first phase-locked loop (PLL) 3, a first transmitter 4a, a second transmitter 4b, and a third transmitter 4c. The first PLL 3 receives a reference clock signal $CLK_{REF}$, and generates a transmit clock signal $CLK_{TX}$. The first to third transmitters 4a-4c can use the transmit clock signal $CLK_{TX}$ to control timing of data transmissions over the first to third lanes 9a-9c.

The first to third lanes 9a-9c operate as conductive pathways used to electrically transmit streams of data between the first and second ICs 1, 2. The first to third lanes 9a-9c can include printed circuit board (PCB) trace, vias, and/or other conductive structures used to provide electrical connections between the first and second ICs 1, 2.

The second IC 2 includes a second PLL 5, a first equalizer 6a, a second equalizer 6b, a third equalizer 6c, a first clock and data recovery (CDR) circuit 7a, a second CDR circuit 7b, and a third CDR circuit 7c. As shown in FIG. 1, the first equalizer 6a can be used to equalize a first input data signal or stream received over the first lane 9a. Additionally, the second equalizer 6b can be used to equalize a second input data stream received over the second lane 9b, and the third equalizer 6c can be used to equalize a third input data stream received over the third lane 9c.

The first to third equalizers 6a-6c can be used to provide signal equalization to compensate for losses of the first to third lanes 9a-9c, respectively. For example, in certain implementations, an equalizer can be used to compensate for high-frequency signal loss by boosting high frequency components of a signal relative to low frequency components of the signal, thereby improving signal fidelity.

The second PLL 5 receives the reference clock signal $CLK_{REF}$ and generates a receive clock signal $CLK_{RX}$. The first CDR circuit 7a receives the first input data stream over the first lane 9a and generates a first output data signal $D_{OUT1}$. Additionally, the second CDR circuit 7b receives the second input data stream over the second lane 9b and generates a second output data signal $D_{OUT2}$, and the third CDR circuit 7c receives the third input data stream over the third lane 9c and generates a third output data signal $D_{OUT3}$.

As shown in FIG. 1, the chip-to-chip communication system 10 communicates over the lanes 9a-9c, which may have correlated jitter. For example, both the first IC 1 and the second IC 2 receive the reference clock signal $CLK_{REF}$. Thus, jitter of the reference clock signal $CLK_{REF}$ may generate correlated jitter in sampling clock signals of the CDR circuits 7a-7c used to recover data from the lanes 9a-9c.

The first to third CDR circuits 7a-7c can track the incoming data received on the lanes 9a-9c to mitigate jitter, such as jitter associated with electromagnetic interference (EMI), coupling, and/or supply switching.

The first CDR circuit 7a can capture data samples and edge samples from the first input data stream received over the first lane 9a. Additionally, the first CDR circuit 7a can generate a master phase signal based on the data samples and the edge samples, and can use the master phase signal to control a phase of a data sampling clock signal used to capture the data samples from the first input data stream.

As shown in FIG. 1, the first CDR circuit 7a also generates a master phase error signal $\Delta\phi_{MASTER}$, which can be based on a change of the master phase signal over time. In certain configurations, the master phase error signal $\Delta\phi_{MASTER}$ corresponds to a difference between the master phase signal and a delayed version of the master phase signal, such as a master phase signal delayed by one or more cycles of the receive clock signal $CLK_{RX}$ or a divided version thereof. However, other configurations are possible. The master phase error signal $\Delta\phi_{MASTER}$ is provided to the second and third CDR circuits 7b, 7c, which process the master phase error signal $\Delta\phi_{MASTER}$ to control phases of second and third data sampling clock signals used to sample the second and third input data streams received over the second and third lanes 9b, 9c, respectively. The illustrated chip-to-chip communication system 10 illustrates one example of an electronic system that can employ phase error forwarding.

As will be described herein, a phase error from a master CDR circuit can be forwarded to one or more slave CDR circuits. Additionally, the master phase error can be processed by the slave CDR circuits, thereby permitting portions of the slave CDR circuits to be powered down for energy efficient data recovery. Thus, the illustrated chip-to-chip communication system 10 uses a phase error forwarding technique to share phase information among parallel lanes.

Accordingly, the first CDR circuit 7a can generate the master phase error signal $\Delta\phi_{MASTER}$ to keep the second and third CDR circuits 7b, 7c in phase-lock. Thus, the illustrated configuration can maintain the benefits of clock and data recovery, such as high-pass filtering of jitter, with reduced power consumption. The first CDR circuit 7a can broadcast or forward phase updates or changes to the second and third CDR circuits 7b, 7c using the master phase error signal $\Delta\phi_{MASTER}$. Additionally, the second and third CDR circuits 7b, 7c can use the master phase error signal $\Delta\phi_{MASTER}$ to control data sampling operations of the input data streams received by the second and third CDR circuits 7b, 7c.

In certain configurations, the master phase error signal $\Delta\phi_{MASTER}$ can be forwarded using an encryption or encoding scheme that allows for phase error updates to be communicated between lanes without stringent specifications related to timing synchronization. In certain configurations, the edge sampler of any disabled CDR circuits can be used for other functions of the chip-to-chip communication system 10. For example, the edge sampler of a disabled slave CDR circuit can be used as a real-time eye opening monitor.

The first IC 1 and the second IC 2 can correspond to ICs of a wide variety of types. In one example, the first IC 1 comprises a field programmable gate array (FPGA) and the second IC 2 comprises a digital-to-analog converter (DAC). In another example, the first IC 1 comprises a microprocessor and the second IC 2 comprises a microprocessor peripheral. Although two examples of ICs that can use chip-to-chip communication have been provided, the teachings herein are applicable to chip-to-chip communication using a wide variety of ICs.

Although the chip-to-chip communication system 10 can use phase error forwarding, in certain configurations the phase error forwarding can be applied only for certain time intervals and/or between certain CDR circuits. For example, the chip-to-chip communication system 10 may operate over an initialization phase in which the first to third CDR circuits 7a-7c track incoming data using separate phase information to determine a phase offset of the second and third CDR circuits 7b, 7c relative to the first CDR circuit 7a. Thereafter, the chip-to-chip communication system 10 may operate over a tracking phase in which the second and third CDR circuits 7b, 7c track or follow the master phase error signal $\Delta\phi_{MASTER}$ forwarded by the first CDR circuit 7a.

In certain configurations, edge tracking circuitry of the second and/or third CDR circuits 7b, 7c can be regularly re-enabled and used in part to generate local phase information for updating the phase offset. For example, the chip-to-chip communication system 10 can employ a token passing scheme in which the second and third CDR circuits 7b, 7c and/or any additional slave CDR circuits pass a token to determine when a particular slave CDR circuit is calibrated to update phase offset. Configuring the slave CDR circuits in this manner can help prevent the slave CDR circuits from losing lock in the presence of phase drift.

Figure 2A:
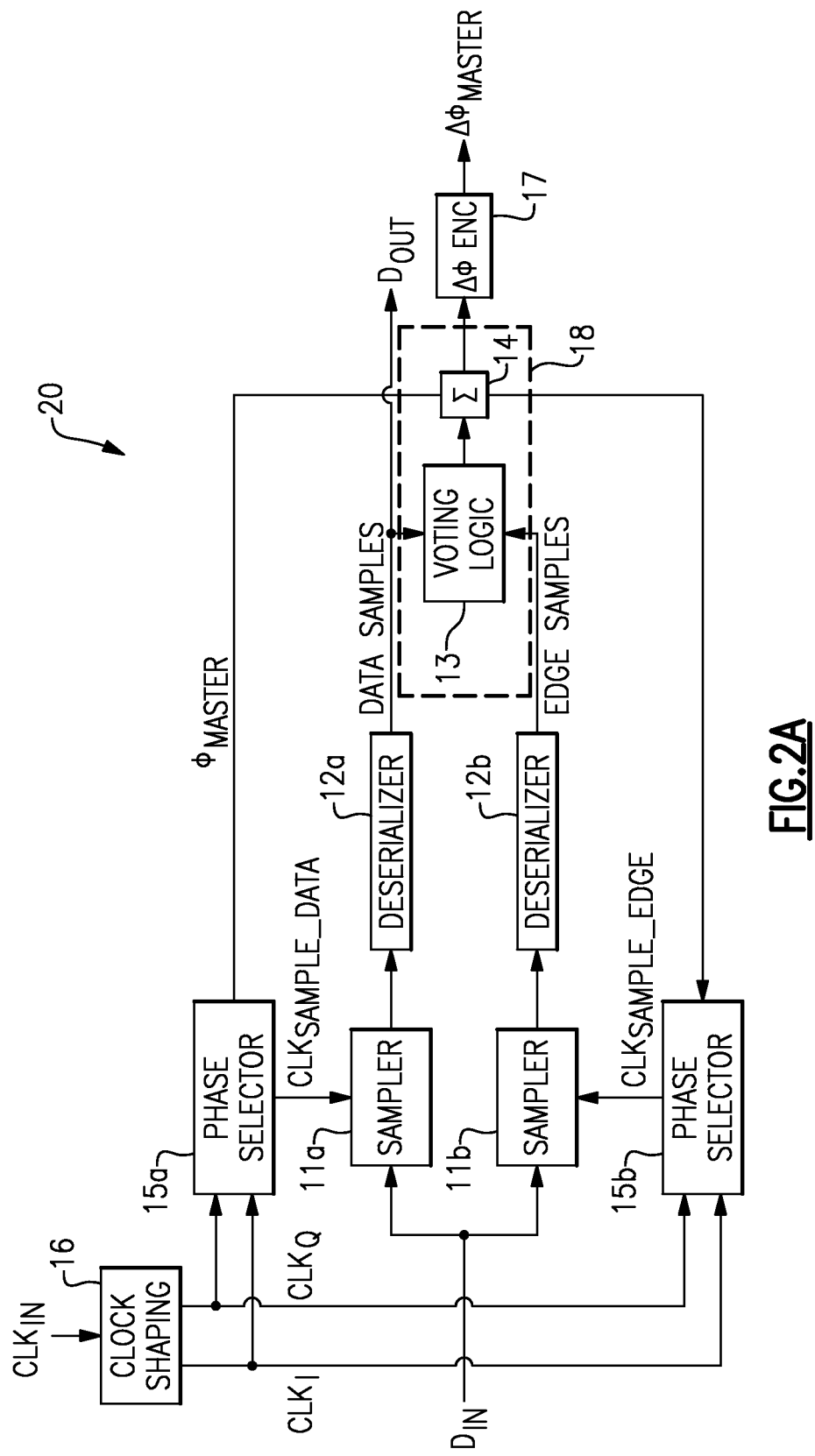
FIG. 2A is a schematic diagram of one embodiment of a master clock and data recovery (CDR) circuit.

FIG. 2A is a schematic diagram of one embodiment of a master clock and data recovery (CDR) circuit 20. The CDR circuit 20 includes a first or data sampler 11a, a second or edge sampler 11b, a first or data deserializer 12a, a second or edge deserializer 12b, a first phase selector 15a, a second phase selector 15b, a clock shaping circuit 16, a phase difference encoder 17, and a phase control circuit 18. The illustrated phase control circuit 18 includes voting logic 13 and an accumulator 14. The CDR circuit 20 receives an input data signal or stream $D_{IN}$ and an input clock signal $CLK_{IN}$, and generates an output data signal $D_{OUT}$ and a master phase error signal $\Delta\phi_{MASTER}$.

The CDR circuit 20 illustrates one example of a master CDR circuit which can provide phase error forwarding to one or more slave CDR circuits. However, the teachings herein are applicable to a wide variety of CDR circuits, including, for example, configurations using more or fewer blocks and/or a different arrangement of blocks.

The illustrated CDR circuit 20 is implemented in a half-rate configuration using two samplers and two phase selectors. For example, the first sampler 11a is configured to sample the input data stream $D_{IN}$ on both rising and falling edges of a data sampling clock signal $CLK_{SAMPLE\_DATA}$ to generate data samples for the first deserializer 12a. Additionally, the second sampler 11b is configured to sample the input data stream $D_{IN}$ on both rising and falling edges of an edge sampling clock signal $CLK_{SAMPLE\_EDGE}$ to generate edge samples for the second deserializer 12b.

The illustrated clock shaping circuit 16 receives an input clock signal $CLK_{IN}$ and generates an in-phase reference clock signal $CLK_I$ and a quadrature-phase reference clock signal $CLK_Q$ for the first and second phase selectors 15a, 15b. Although the clock shaping circuit 16 is illustrated as receiving one input clock signal and generating two reference clock signals, other configurations are possible, such as implementations in which the clock shaping circuit 16 receives additional input clock signals and/or generates more or fewer reference clock signals. In another embodiment, the clock shaping circuit 16 is omitted in favor of providing one or more reference clock signals directly to clock generation circuitry used to generate data and edge sampling clock signals.

As illustrated in FIG. 2A, the first phase selector 15a generates the data sampling clock signal $CLK_{SAMPLE\_DATA}$ and the second phase selector 15b generates the edge sampling clock signal $CLK_{SAMPLE\_EDGE}$. In certain configurations, the first and second phase selectors 15a, 15b can generate the data and edge sampling clock signals $CLK_{SAMPLE\_DATA}$, $CLK_{SAMPLE\_EDGE}$ by interpolating the in-phase and quadrature-phase reference clock signals $CLK_I$, $CLK_Q$ generated by the clock shaping circuit 16 based on a master phase signal $\phi_{MASTER}$ generated by the phase control circuit 18. In certain implementations, the first and second phase selectors 15a, 15b can maintain a quadrature phase relationship between the data and edge phase sampling clock signals $CLK_{SAMPLE\_DATA}$, $CLK_{SAMPLE\_EDGE}$ and can move the sampling clock signals in lock-step.

The input data stream $D_{IN}$ can include a string of serial data bits that transition at a data rate. At a given data rate, the input data stream $D_{IN}$ has a unit interval (UI), or minimum time interval between transitions of the input data stream $D_{IN}$. When the CDR circuit 20 is in a lock condition, the samples can be taken from specific positions into the UI of the input data stream $D_{IN}$. For example, the samples taken by the data sampler 11a can include data samples taken from the middle of the UI, and the samples taken by the edge sampler 11b can include edge samples taken at the ends of the UI.

In certain configurations, the input data stream $D_{IN}$ received by the CDR circuit 20 can have a data rate of $F_{DATA}$. Additionally, the data output signal $D_{OUT}$ can correspond to a k-bit parallel data word having a data rate of $F_{DATA}/k$. Thus, the CDR circuit 20 can operate as a deserializer.

In the illustrated configuration, the data sampler 11a provides data samples to the first deserializer 12a, and the edge sampler 11b provides edge samples to the second deserializer 12b. The first and second deserializers 12a, 12b can be used to deserialize the data and edge samples, respectively.

In the illustrated configuration, the first deserializer 12a provides the deserialzed data samples to the data output terminal $D_{OUT}$ and to the voting logic 13, and the second deserializer 102b provides the deserialzed edge samples to the voting logic 13. By deserializing the samples, the first and second deserializers 12a, 12b can provide the captured samples to the phase control circuit 18 at a reduced bit rate, thereby relaxing an operating frequency design constraint of the phase control circuit 18. In one embodiment, the first and second deserializers 12a, 12b deserialize the data and edge samples streams by a factor of 8 or more.

In the illustrated configuration, the phase control circuit 18 includes the voting logic 13 and the accumulator 14, which can be used to generate the master phase signal $\phi_{MASTER}$. The master phase signal $\phi_{MASTER}$ is provided to the first phase selector 15a, which can use the master phase signal $\phi_{MASTER}$ to control timing of the data sampling clock signal $CLK_{SAMPLE\_DATA}$.

In certain configurations, the voting logic 13 can increase or decrease a value stored in the accumulator 14 to control the master phase signal $\phi_{MASTER}$. The voting logic 13 can be used to process timing of data transitions between the edge and data samples so as to shift the data and edge sampling clock signals $CLK_{SAMPLE\_DATA}$, $CLK_{SAMPLE\_EDGE}$ earlier or later in time to align the data and edge sampling clock signals $CLK_{SAMPLE\_DATA}$, $CLK_{SAMPLE\_EDGE}$ relative to the UI of the input data stream $D_{IN}$. In certain implementations, the accumulator 14 is a digital wrapping accumulator.

The first phase selector 15a can be used to generate the data sampling clock signal $CLK_{SAMPLE\_DATA}$ based on the master phase signal $\phi_{MASTER}$ and the in-phase and quadrature-phase reference clock signals $CLK_I$, $CLK_Q$. For example, the first phase selector 15a can be used to interpolate the in-phase reference clock signal $CLK_I$ and the quadrature-phase reference clock signal $CLK_Q$ to generate the data sampling clock signal $CLK_{SAMPLE\_DATA}$ with a phase indicated by the master phase signal $\phi_{MASTER}$.

As shown in FIG. 2A, the phase control circuit 18 also generates a phase signal for the second phase selector 15b. Additionally, the second phase selector 15b can interpolate the in-phase reference clock signal $CLK_I$ and the quadrature-phase reference clock signal $CLK_Q$ based on the phase signal. The phase signal provided to the second phase selector 15b can be, for example, the master phase signal $\phi_{MASTER}$ or a phase-shifted version thereof. For example, in certain configurations, the first and second phase selectors 15a, 15b have a similar circuit implementation as one another, and the master phase signal $\phi_{MASTER}$ provided to the first phase selector 15a and the phase signal provided to the second phase selector 15b can be about 90 degrees out of phase. In other configurations, the first and second phase selectors 15a, 15b have different circuit implementations and/or receive different reference clock signals, and both the first and second phase selectors 15a, 15b can receive the master phase signal $\phi_{MASTER}$.

The CDR circuit 20 includes an embedded delay-locked loop (DLL), which can be used to phase-lock the CDR circuit 20 to the input data stream $D_{IN}$. The embedded DLL can include the first and second samplers 11a, 11b, the first and second deserializers 12a, 12b, the phase control circuit 18, and the first and second phase selectors 15a, 15b. The DLL operates to set a value of the master phase signal $\phi_{MASTER}$ to control sampling of the input data stream $D_{IN}$. The master phase signal $\phi_{MASTER}$ can be adjusted to reduce or minimize individual bit errors of the k-bit output word generated by the CDR circuit 20 by controlling the alignment of the data and edge sampling clock signals $CLK_{SAMPLE\_DATA}$, $CLK_{SAMPLE\_EDGE}$ relative to the UI of the input data stream $D_{IN}$.

As shown in FIG. 2A, the CDR circuit 20 also includes the phase difference encoder 17, which generates the master phase error signal $\Delta\phi_{MASTER}$ based on a change of the master phase signal $\phi_{MASTER}$ over time. In certain configurations, the phase difference encoder 17 generates the master phase error signal $\Delta\phi_{MASTER}$ based on encoding a difference between the master phase signal $\phi_{MASTER}$ and a delayed version thereof. The master phase error signal $\Delta\phi_{MASTER}$ can be provided to one or more slave CDR circuits for phase error forwarding.

Figure 2B:
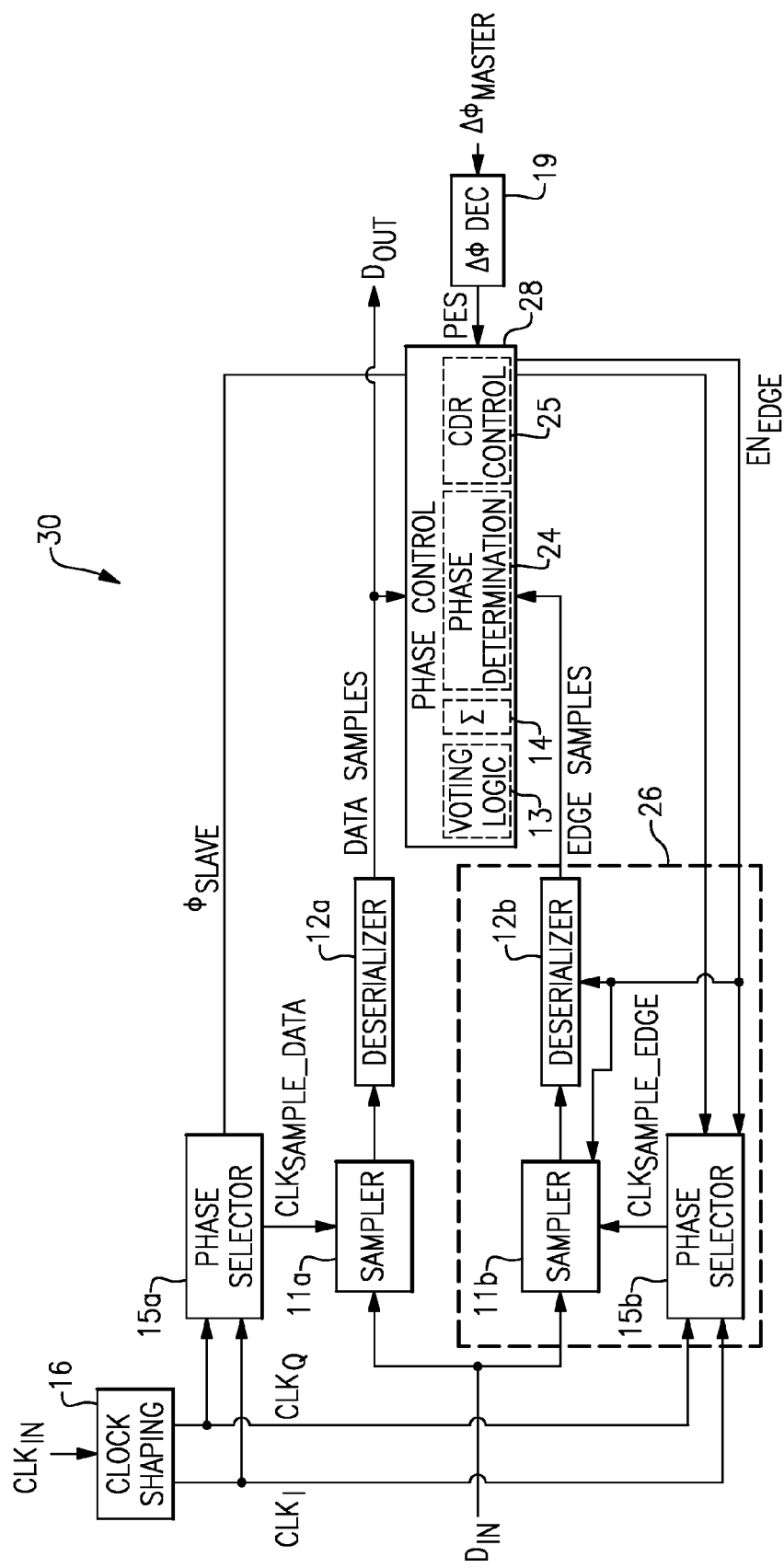
FIG. 2B is a schematic diagram of one embodiment of a slave CDR circuit.

FIG. 2B is a schematic diagram of one embodiment of a slave CDR circuit 30. The CDR circuit 30 includes the first and second samplers 11a, 11b, the first and second deserializers 12a, 12b, the first and second phase selectors 15a, 15b, and the clock shaping circuit 16, which can be as described earlier. The slave CDR circuit 30 further includes a phase difference decoder 19 and a phase control circuit 28 that includes voting logic 13, an accumulator 14, a phase determination circuit 24, and a CDR control circuit 25.

The CDR circuit 30 illustrates one example of a slave CDR circuit which receives phase error information forwarded from a master CDR circuit, such as the master CDR circuit 20 of FIG. 2A. However, the teachings herein are application to a wide variety of CDR circuits, including, for example, CDR circuits using more or fewer blocks and/or a different arrangement of blocks.

The phase difference decoder 19 receives the master phase error signal $\Delta\phi_{MASTER}$, and decodes the master phase error signal $\Delta\phi_{MASTER}$ to generate a decoded phase error signal PES. The phase control circuit 28 receives the decoded phase error signal PES and data and edge samples from the first and second deserializers 12a, 12b. As shown in FIG. 2B, the phase control circuit 28 generates a slave phase signal $\phi_{SLAVE}$, which is provided to the first phase selector 15a. The first phase selector 15a uses the slave phase signal $\phi_{SLAVE}$ to control a phase of the data sampling clock signal $CLK_{SAMPLE\_DATA}$ used to capture the data samples from the input data stream $D_{IN}$.

When the CDR circuit 30 is operating using phase error forwarding, the phase control circuit 28 can generate the slave phase signal $\phi_{SLAVE}$ based on the decoded phase error signal PES. However, when the CDR circuit 30 is not operating using phase error forwarding, the phase control circuit 28 can generate the slave phase signal $\phi_{SLAVE}$ based on the data and edge samples generated by the first and second deserializers 12a, 12b.

As shown in FIG. 2B, the phase control circuit 28 generates an edge tracking enable signal $EN_{EDGE}$. Additionally, the edge tracking enable signal $EN_{EDGE}$ is provided to edge tracking circuitry 26, which includes the edge sampler 11b, the edge deserializer 12b, and the second phase selector 15b. The edge tracking enable signal $EN_{EDGE}$ can be used to turn on or off all or part of the edge tracking circuitry 26 when the CDR circuit 30 is tracking the input data stream $D_{IN}$ based on the forwarded master phase error signal $\Delta\phi_{MASTER}$. Thus, when the CDR circuit 30 operates with phase error forwarding, the edge tracking enable signal $EN_{EDGE}$ can be used to disable the edge tracking circuitry 26 to conserve power. However, when the CDR circuit 30 does not operate with phase error forwarding, the edge tracking circuitry 26 can remain turned on, and the voting logic 13 and the accumulator 14 can be used to generate a local phase signal used to control a value of the slave phase signal $\phi_{SLAVE}$.

The phase control circuit 28 also generates a phase signal for the second phase selector 15b. The phase signal provided to the second phase selector 15b can be, for example, the slave phase signal $\phi_{SLAVE}$ or a phase-shifted version thereof. For example, in certain configurations, the first and second phase selectors 15a, 15b have a similar circuit implementation as one another, and the slave phase signal $\phi_{SLAVE}$ provided to the first phase selector 15a and the phase signal provided to the second phase selector 15b are about 90 degrees out of phase. In other configurations, the first and second phase selectors 15a, 15b have different circuit implementations and/or receive different reference clock signals, and both the first and second phase selectors 15a, 15b receive the slave phase signal $\phi_{SLAVE}$.

When operating with phase error forwarding, the phase control circuit 28 can used to process the decoded phase error signal PES to update the slave phase signal $\phi_{SLAVE}$. The phase control circuit 28 includes the phase determination circuit 24 and the CDR control circuit 25, which can aid the phase control circuit 28 in processing the decoded phase error signal PES and in generating the slave phase signal $\phi_{SLAVE}$. Various embodiments of the phase determination circuit 24 and the CDR control circuit 25 are described in detail further below with reference to FIGS. 5, 7, and 8.

Additional details of the CDR circuit 30 can be similar to those described earlier.

Figure 2C:
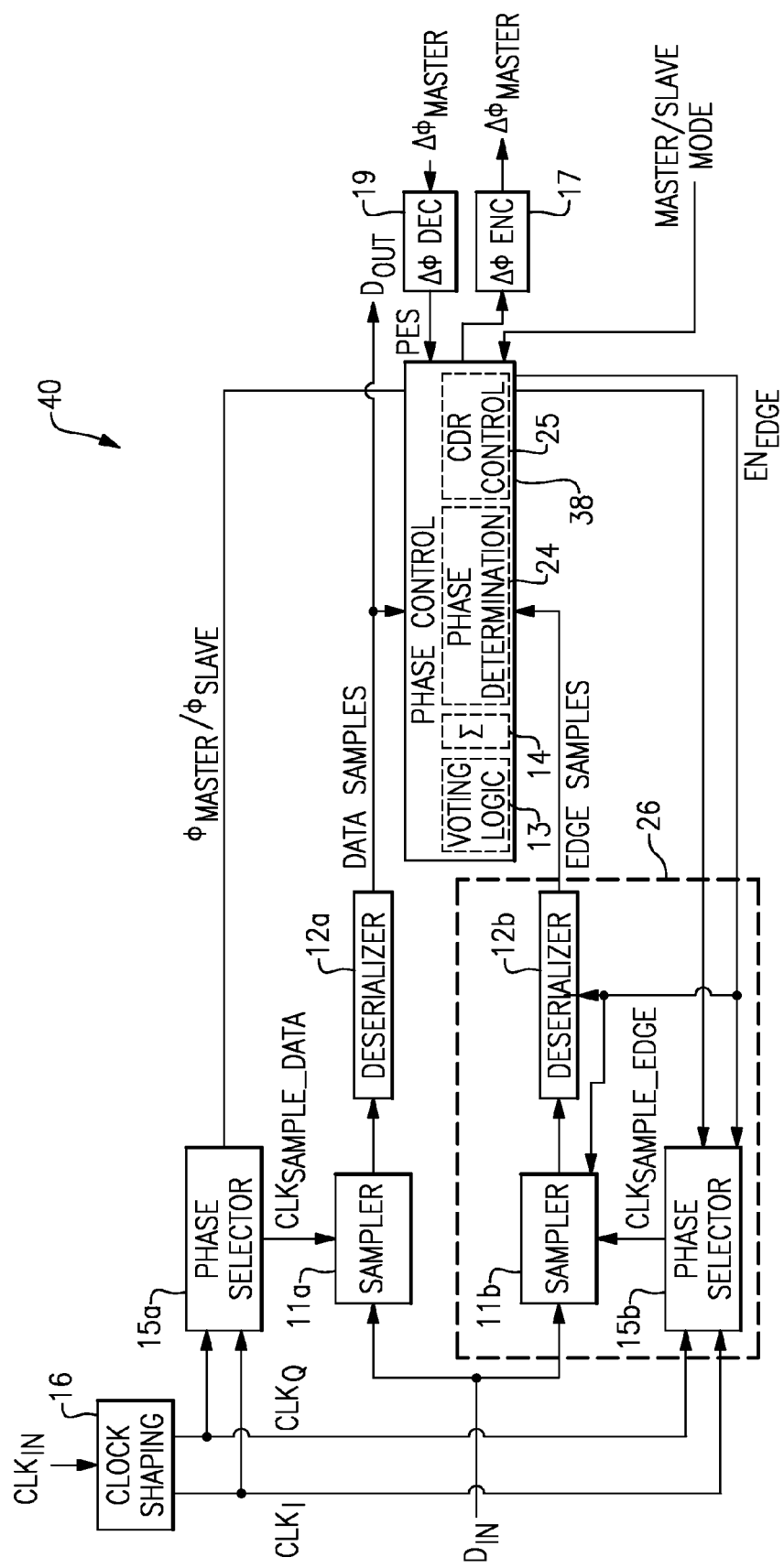
FIG. 2C is a schematic diagram of one embodiment of a configurable master/slave CDR circuit.

FIG. 2C is a schematic diagram of one embodiment of a configurable master/slave CDR circuit 40. The CDR circuit 40 includes the first and second samplers 11a, 11b, the first and second deserializers 12a, 12b, the first and second phase selectors 15a, 15b, the clock shaping circuit 16, the phase difference encoder 17, and the phase difference decoder 19, which can be as described earlier. The CDR circuit 40 further includes a phase control circuit 38 that includes voting logic 13, the accumulator 14, the phase determination circuit 24, and the CDR control circuit 25.

The CDR circuit 40 illustrates one example of a CDR circuit that can be configured in either a master mode or in a slave mode. As shown in FIG. 2C, the phase control circuit 38 receives a master/slave mode control signal, which can be used to control operation of the CDR circuit 40 as either a master CDR circuit or a slave CDR circuit. When operating in the master mode, the phase difference encoder 17 can be used to generate the master phase error signal $\phi\Delta_{MASTER}$, which can be forwarded to one or more slave CDR circuits. Additionally, when operating in the slave mode, the phase difference decoder 19 can receive the master phase error signal $\Delta\phi_{MASTER}$, which can be decoded to generate a decoded phase error signal PES for the phase control circuit 38.

A CDR circuit that can be operated in either a master mode or a slave mode can enhance the flexibility of a chip-to-chip communication system. For example, the chip-to-chip communication system can include two or more CDR circuits that are configurable in a master mode or a slave mode, and a particular CDR circuit can operate as master or slave depending on a particular application and/or operating environment of the chip-to-chip communication system.

Additional details of the CDR system 40 can be similar to those described earlier.

Figure 3:
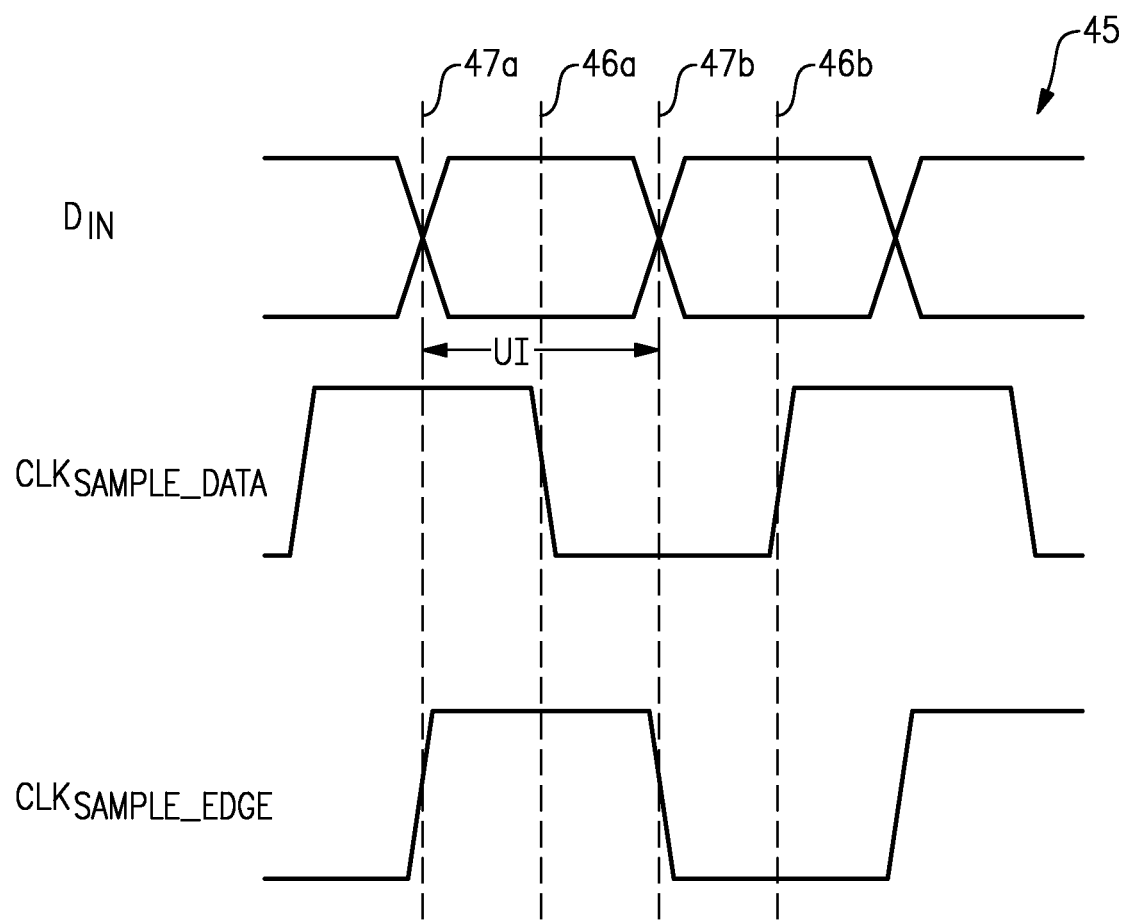
FIG. 3 is a graph illustrating one example of a timing diagram for a CDR circuit.

FIG. 3 is a graph illustrating one example of a timing diagram 45 for a CDR circuit. The timing diagram 45 illustrates a configuration of a half-rate CDR circuit, and illustrates one example of possible timing of the CDR circuits of FIGS. 2A-2C. However, other configurations of timing are possible.

The timing diagram 45 includes a first plot of an input data signal or stream $D_{IN}$, a second plot of a data sampling clock signal $CLK_{SAMPLE\_DATA}$, and a third plot of an edge sampling clock signal $CLK_{SAMPLE\_EDGE}$. The timing diagram 45 has been annotated to illustrate sampling times of a first data sample 46a, a second data sample 46b, a first edge or transition sample 47a, and a second edge sample 47b. The timing diagram 45 has also been annotated to show a unit interval (UI) of the input data stream $D_{IN}$.

Figure 4A:
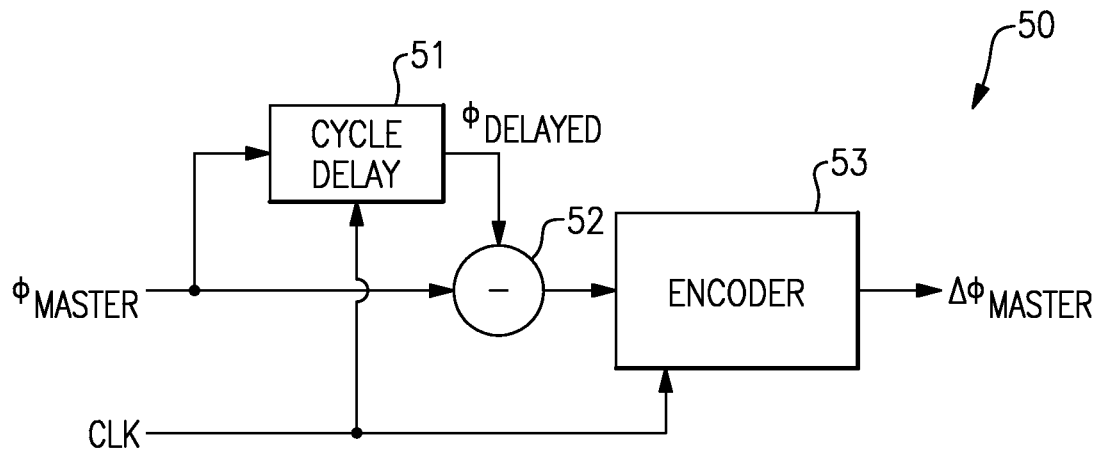
FIG. 4A is a schematic diagram of a phase difference encoder according to one embodiment.

FIG. 4A is a schematic diagram of a phase difference encoder 50 according to one embodiment. The phase difference encoder 50 includes a cycle delay circuit 51, a subtraction circuit 52, and an encoder 53. The illustrated phase difference encoder 50 receives a master phase signal $\phi_{MASTER}$ and a clock signal CLK and generates a master phase error signal $\Delta\phi_{MASTER}$ that is encoded.

The cycle delay circuit 51 receives the clock signal CLK and the master phase signal $\phi_{MASTER}$, and can generate a delayed master phase signal $\phi_{DELAYED}$ by delaying the master phase signal $\phi_{MASTER}$ by one or more cycles of the clock signal CLK. In certain configurations, the cycle delay circuit 51 generates the delayed master phase signal $\phi_{DELAYED}$ based on delaying the master phase signal $\phi_{MASTER}$ for two or more cycles of the clock signal CLK. However, other configurations are possible.

Increasing a delay of the cycle delay circuit 51 can increase a time between updates or changes to the master phase error signal $\Delta\phi_{MASTER}$, which can ease timing constraints in forwarding the master phase error signal $\Delta\phi_{MASTER}$ to one or more slave CDR circuits. However, delaying the master phase signal $\phi_{MASTER}$ by a relatively large number of cycles may also degrade the slave CDR circuits' ability to maintain lock in the presence of large amounts of jitter.

The subtraction circuit 52 includes a first input that receives the master phase signal $\phi_{MASTER}$, a second input that receives the delayed master phase signal $\phi_{DELAYED}$, and an output that generates a phase difference signal corresponding to a difference between the master phase signal $\phi_{MASTER}$ and the delayed master phase signal $\phi_{DELAYED}$. The encoder 53 receives the phase difference signal and the clock signal CLK, and can encode the phase difference signal to generate the master phase error signal $\Delta\phi_{MASTER}$.

The master phase error signal $\Delta\phi_{MASTER}$ can be provided to one or more slave CDR circuits and can be used for phase error forwarding.

Figure 4B:
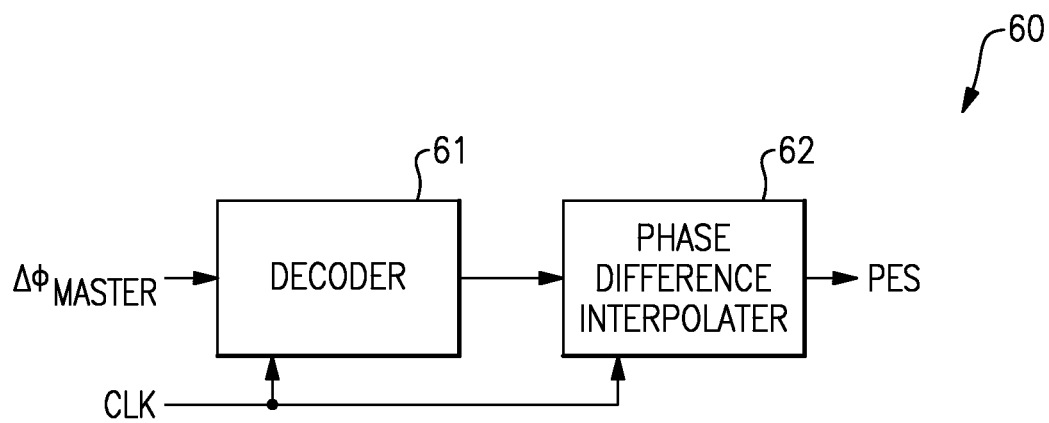
FIG. 4B is a schematic diagram of a phase difference decoder according to one embodiment.

FIG. 4B is a schematic diagram of a phase difference decoder 60 according to one embodiment. The phase difference decoder 60 includes a decoder 61 and a phase difference interpolator 62. The phase difference decoder 60 receives a clock signal CLK and the master phase error signal $\Delta\phi_{MASTER}$, which can be generated by the phase difference encoder 50 of FIG. 4A. The phase difference decoder 60 generates a decoded phase error signal PES that can be used to adjust a slave phase signal in a slave CDR circuit.

As shown in the FIG. 4B, the decoder 61 receives the clock signal CLK and the master phase error signal $\Delta\phi_{MASTER}$, and can decode the master phase error signal $\Delta\phi_{MASTER}$ to generate a decoded master phase difference signal for the phase difference interpolator 62. The phase difference interpolator 62 receives the decoded master phase difference signal and the clock signal CLK, and can generate the decoded phase error signal PES by interpolating the decoded master phase difference signal over two or more cycles of the clock signal CLK, such as by a number of cycles of delay provided by the cycle delay circuit 51 of FIG. 4A.

For example, in one embodiment in which the cycle delay circuit 51 of FIG. 4A delays the master phase signal $\phi_{MASTER}$ by k cycles, the phase difference interpolator 62 can generate the decoded phase error signal PES based on interpolating the decoded master phase difference signal over k cycles. By including the phase difference interpolator 62, changes to a slave phase signal of a slave CDR circuit can occur more gradually relative to a configuration in which the decoded phase error signal PES is incremented or decremented only once every k cycles.

Figure 5:
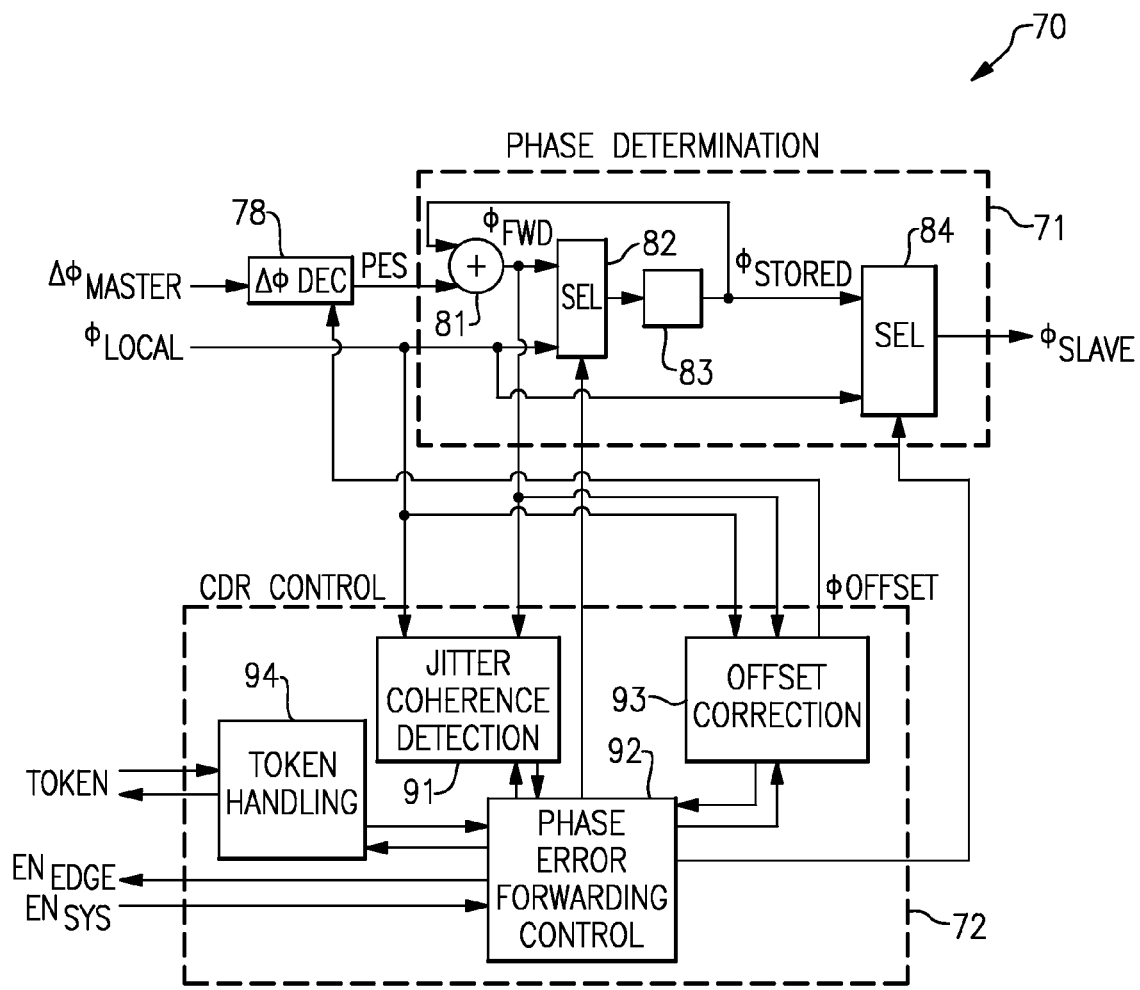
FIG. 5 is a schematic diagram of a portion of a CDR circuit according to one embodiment.

FIG. 5 is a schematic diagram of a CDR sub-circuit 70 according to one embodiment. The illustrated CDR sub-circuit 70 includes a phase difference decoder 78, a phase determination circuit 71, and a CDR control circuit 72. The CDR sub-circuit 70 can represent a portion of a CDR circuit. For example, the phase determination circuit 71 and the CDR control circuit 72 can be included in a phase control circuit, such as the phase control circuit 28 of FIG. 2B or the phase control circuit 38 of FIG. 2C. Additionally, the phase difference decoder 78 illustrates one implementation of a phase difference decoder, such as the phase difference decoder 19 of FIGS. 2B and 2C.

The phase difference decoder 78 receives the master phase error signal $\Delta\phi_{MASTER}$ and a phase offset signal $\phi_{OFFSET}$. Additionally, the phase difference decoder 78 generates a decoded phase error signal PES, which is provided to the phase determination circuit 71.

The illustrated phase determination circuit 71 includes an adder 81, a first selection circuit 82, registers 83, and a second selection circuit 84. The adder 81 can be used to add a stored phase signal $\phi_{STORED}$ from the registers 83 and the decoded phase error signal PES to generate a forwarded phase signal $\phi_{FWD}$. The first selection circuit 82 can be used to select between the forwarded phase signal $\phi_{FWD}$ and a local phase signal $\phi_{LOCAL}$ as an input to the registers 83. The local phase signal $\phi_{LOCAL}$ can be generated by, for example, an accumulator of a slave CDR circuit when the slave CDR circuit is operating without phase error forwarding. The second selection circuit 84 can be used to generate the slave phase signal $\phi_{SLAVE}$ by selecting between the stored phase signal $\phi_{STORED}$ and the local phase signal $\phi_{LOCAL}$. As described earlier, the slave phase signal $\phi_{SLAVE}$ can be used to control a phase of a data sampling clock signal used to capture data samples from an input data stream received by the slave CDR circuit.

When the first selection circuit 82 selects the forwarded phase signal $\phi_{FWD}$, the registers 83 can be used to store a sum of the forwarded phase signal $\phi_{FWD}$ and the decoded phase error signal PES. Additionally, when the second selection circuit 84 selects the stored phase signal $\phi_{STORED}$, the slave phase signal $\phi_{SLAVE}$ can correspond to the stored phase signal $\phi_{STORED}$. Thus, the slave phase signal $\phi_{SLAVE}$ can be generated using phase error forwarding, and the slave phase signal $\phi_{SLAVE}$ can track master phase information via changes to the decoded phase error signal PES.

However, when the first selection circuit 82 selects the local phase signal $\phi_{LOCAL}$, the registers 83 can be used to store the local phase signal $\phi_{LOCAL}$. Additionally, when the second selection circuit 84 selects the local phase signal $\phi_{LOCAL}$, the slave phase signal $\phi_{SLAVE}$ can correspond to the local phase signal $\phi_{LOCAL}$. Thus, when phase error forwarding is not used, the slave phase signal $\phi_{SLAVE}$ can be generated using phase information local to the slave CDR circuit.

The illustrated CDR control circuit 72 includes a jitter coherence detection circuit 91, a phase error forwarding control circuit 92, an offset correction circuit 93, and a token handling circuit 94.

The jitter coherence detection circuit 91 receives the local phase signal $\phi_{LOCAL}$ and the forwarded phase signal $\phi_{FWD}$, and provides a jitter coherence signal to the phase error forwarding control circuit 92. The phase error forwarding control circuit 92 receives a system enable $EN_{SYS}$ and generates an edge tracking enable signal $EN_{EDGE}$. The phase error forwarding control circuit 92 also controls the selections of the first and second selection circuits 82, 84, and can send or receive one or more signals to or from the jitter coherence detection circuit 91, the offset correction circuit 93, and/or the token handling circuit 94 to provide control over clock and data recovery operations. The offset correction circuit 93 receives the local phase signal $\phi_{LOCAL}$ and the forwarded phase signal $\phi_{FWD}$, and generates a phase offset signal $\phi_{OFFSET}$, which is provided to the phase difference decoder 78 in the illustrated configuration. The token handling circuit 94 can send or receive a token TOKEN over a token handling interface.

The jitter coherence detection circuit 91 can generate a jitter coherency signal that indicates whether or not jitter between a first input data stream received by a master CDR circuit and a second input data stream received by a slave CDR circuit is coherent. In certain configurations, jitter coherency is determined in part by tracking incoming data in the master CDR circuit and the slave CDR circuit separately, and observing a difference between the local phase signal $\phi_{LOCAL}$ and the forwarded phase signal $\phi_{FWD}$. When the jitter between the data streams is not coherent, it may unreliable to use phase error forwarding. Thus, when the jitter coherency signal indicates that the jitter is incoherent, the phase error forwarding control circuit 92 can turn on the slave CDR circuit's local edge tracking circuitry, and control the second phase selection circuit 84 to generate the slave phase signal $\phi_{SLAVE}$ using the local phase signal $\phi_{LOCAL}$. However, when the jitter between the lanes is coherent, the jitter coherence detection circuit 91 should not inhibit the phase error forwarding control circuit 92 from using phase error forwarding.

The offset correction circuit 93 can be used to generate the phase offset signal $\phi_{OFFSET}$, which can indicate a phase offset of a slave phase signal (for example, $\phi_{SLAVE}$ of FIG. 2B) of a slave CDR circuit relative to a master phase signal (for example, $\phi_{MASTER}$ of FIG. 2A) of a master CDR circuit. In certain configurations, a chip-to-chip communication system includes two or more slave CDR circuits, and each of the slave CDR circuits can have different phase offsets relative to one another. Thus, the phase offset $\phi_{OFFSET}$ can be separately set for each slave CDR circuit to enhance tracking and/or to reduce output bit errors.

The phase offset signal $\phi_{OFFSET}$ can be generated in a variety of ways, such as by tracking incoming data in a master CDR circuit and a slave CDR circuit over several clock cycles, and observing a difference between the forwarded phase signal $\phi_{FWD}$ and the local phase signal $\phi_{LOCAL}$. In one embodiment, the phase offset signal $\phi$OFFSET corresponds to an average observed difference between the forwarded phase signal $\phi_{FWD}$ and the local phase signal $\phi_{LOCAL}$ over an observation interval.

In certain configurations, a slave CDR circuit can operate using phase error forwarding, but the phase offset signal $\phi_{OFFSET}$ may be regularly calibrated or updated. Configuring the slave CDR circuit in this manner can enhance the robustness of phase error forwarding, and can be used to compensate for a phase drift between the master CDR circuit and the slave CDR circuit over time.

In certain configurations, the phase offset $\phi_{OFFSET}$ is determined during an interval of time in which the slave CDR circuit holds a token received over a token handling interface. In the illustrated configuration, the CDR control circuit 72 includes the token handling circuit 94, which can aid the CDR circuit in receiving and passing the token over the token handling interface. As shown in FIG. 5, the token handling circuit 94 can communicate with the phase error forwarding control circuit 92. When the token is received, the phase offset $\phi_{OFFSET}$ can be updated.

In the illustrated configuration, the phase offset $\phi_{OFFSET}$ is provided to the phase difference decoder 78, which can interpolate the phase offset $\phi_{OFFSET}$ over multiple clock cycles. However, other configurations are possible, such as implementations in which the phase offset $\phi_{OFFSET}$ is directly added to the forwarded phase signal $\phi_{FWD}$.

Figure 6:
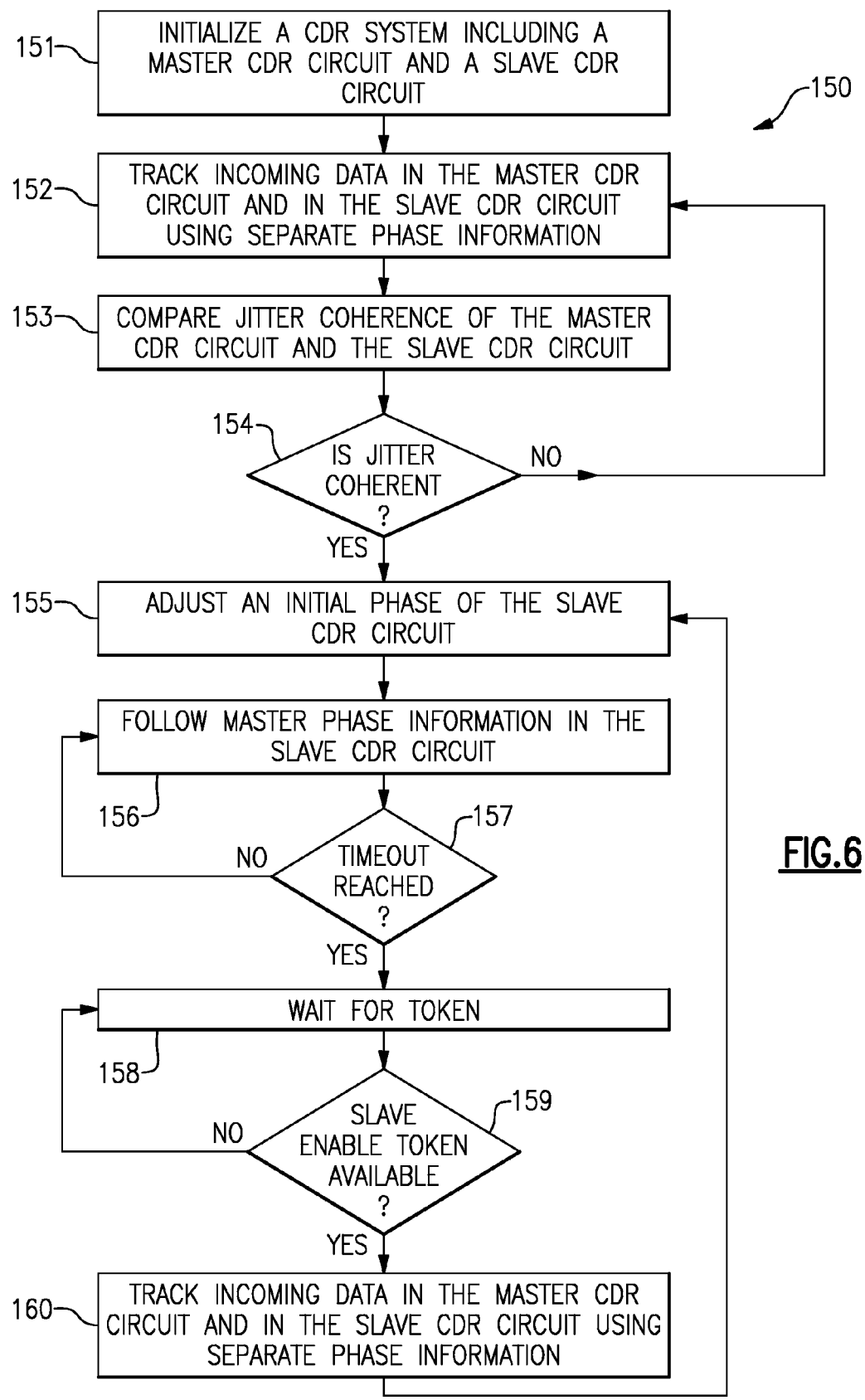
FIG. 6 is a flow diagram of a method of clock and data recovery according to one embodiment.

FIG. 6 is a flow diagram of a method 150 of clock and data recovery according to one embodiment. The method 150 can be used for recovering data in a chip-to-chip communication system, such as the chip-to-chip communication system 10 of FIG. 1. It will be understood that the method may include greater or fewer operations.

The illustrated method 150 of clock and data recovery starts at block 151, in which a CDR system including a master CDR circuit and a slave CDR circuit is initialized. Although not described in block 151, the CDR system can include additional slave CDR circuits. The CDR system can be, for example, a chip-to-chip communication system. During initialization, the master and slave CDR circuits can wait for ancillary blocks to power-up and/or complete any initialization procedures. For instance, the master and slave CDR circuits can wait for one or more PLLs to lock and/or for any adaptive equalizers to initialize.

The method 150 continues at a block 152, in which incoming data is tracked using the master CDR circuit and the slave CDR circuit using separate phase information. Thus, in block 152, phase error forwarding is not used.

In an ensuing block 153 the jitter coherence of the master CDR circuit and the slave CDR circuit is compared. Once both the master CDR circuit and the slave CDR circuit are tracking their own respective input data streams, the slave CDR circuit can continue to track its input data stream while comparing local phase information to the phase information forwarded by the master. Configuring the slave CDR circuit in this manner can aid in assessing a coherence of jitter between the master CDR circuit and the slave CDR circuit.

The method 150 continues at a decision block 154 in which it is determined if the jitter is coherent or incoherent. The jitter coherence of the master CDR circuit and the slave CDR circuit can be compared in a variety of ways. In certain configurations, the slave CDR circuit determines a phase difference between local phase information and the phase information forwarded by the master, and compares the phase difference to a threshold phase or phase tolerance. Additionally, when the phase difference is determined to be less than the threshold phase, the jitter is determined to be coherent. However, when the phase difference is greater than or equal to the threshold phase, the jitter is determined to be incoherent.

When the result of the decision block 154 is no, the method returns to block 152, in which the incoming data is tracked in the master CDR circuit and the slave CDR circuit using separate phase information. Thus, when the jitter is deemed to be incoherent, the slave CDR circuit may continue to track incoming data using separate phase information.

However, when the result of the decision block 154 is yes, the method continues at a block 155, in which the initial phase or phase offset of the slave CDR circuit is adjusted.

For a slave CDR circuit to effectively track a master CDR circuit using phase error forwarding, the slave CDR circuit should have an appropriate initial phase offset relative to the master CDR circuit. In block 155, the initial phase of the slave CDR circuit can be adjusted or calibrated to determine the phase offset between the slave CDR circuit and the master CDR circuit. The phase offset can be used to enhance the accuracy of phase error forwarding and/or to reduce bit errors in an output data signal generated by the slave CDR circuit. In certain configurations, the initial phase can be adjusted to calibrate out a residual phase difference between the master CDR circuit and the slave CDR circuit by averaging an error between a forwarded phase and a local phase over an observation interval.

In an ensuing block 156, the slave CDR circuit follows the master phase information. To conserve power, certain circuitry of the slave CDR circuit, such as edge tracking circuitry and/or DLL control circuitry can be turned off to reduce power consumption.

In certain configurations, the master CDR circuit generates an encoded phase difference signal representing a change to the master's phase signal over two or more clock cycles. The encoded phase difference signal can be forwarded to the slave CDR circuit, and decoded and interpolated over the two or more clock cycles to generate a decoded phase error signal the can be used to adjust the slave CDR circuit's local phase signal.

The method 150 continues at a decision block 157, in which the slave CDR circuit determines if a timeout has been reached. In certain configurations, the slave CDR circuit may follow the master phase information until timeout. The duration of the timeout can be determined in a variety of ways, such as by a particular number of clock cycles. However, other configurations are possible. When the result of the decision block 157 is no, the method returns to block 156, in which the slave CDR circuit follows the master phase information.

However, when the result of the decision block 157 is yes, the method 150 continues to a block 158, in which slave CDR circuit waits for a token. The slave CDR circuit may be one of several slave CDR circuits that operate using phase information forwarded by the master CDR circuit. However, when there are multiple slave CDR circuits, it may be advantageous to calibrate less than all of the slave CDR circuits at a time. Configuring the slave CDR circuits in this manner can reduce a magnitude of a power supply perturbation associated with calibration. Accordingly, in certain configurations, the slave CDR circuits may use a token passing scheme to periodically calibrate the phase offset of the slave CDR circuits, while avoiding power glitches and/or surges associated with powering the edge tracking circuitry of two or more of the slave CDR circuits simultaneously.

The method 150 continues at a decision block 159, in which the slave CDR circuit determines if a slave enable token is available.

When the result of the decision block 159 is no, the method returns to block 158, in which the slave CDR circuit waits for the token. However, when the result of the decision block 159 is yes, the method continues at a block 160, in which the master CDR circuit and the slave CDR circuit track incoming data using separate phase information. The method 150 returns to block 155, in which the initial phase of the slave CDR circuit is adjusted. In the block 155, the phase offset of the slave CDR circuit can be calibrated. Accordingly, a slave CDR circuit can intermittently turn on its own edge tracking and DLL circuitry to ensure that the slave CDR circuit is following a correct phase associated with its own input data stream.

When the slave CDR circuit is finished with the token and is ready to follow the master CDR circuit's phase information, the slave CDR circuit can release the token. Accordingly, in certain configurations, the slave CDR circuit can release the token after adjusting the initial phase of the slave CDR circuit in block 155.

Although FIG. 6 illustrates one embodiment of a method of clock and data recovery, other embodiments are possible. For example, in another embodiment, a slave CDR circuit can operate in a tracking mode whereby the slave CDR circuit follows the master CDR circuit's phase information indefinitely.

Figure 7:
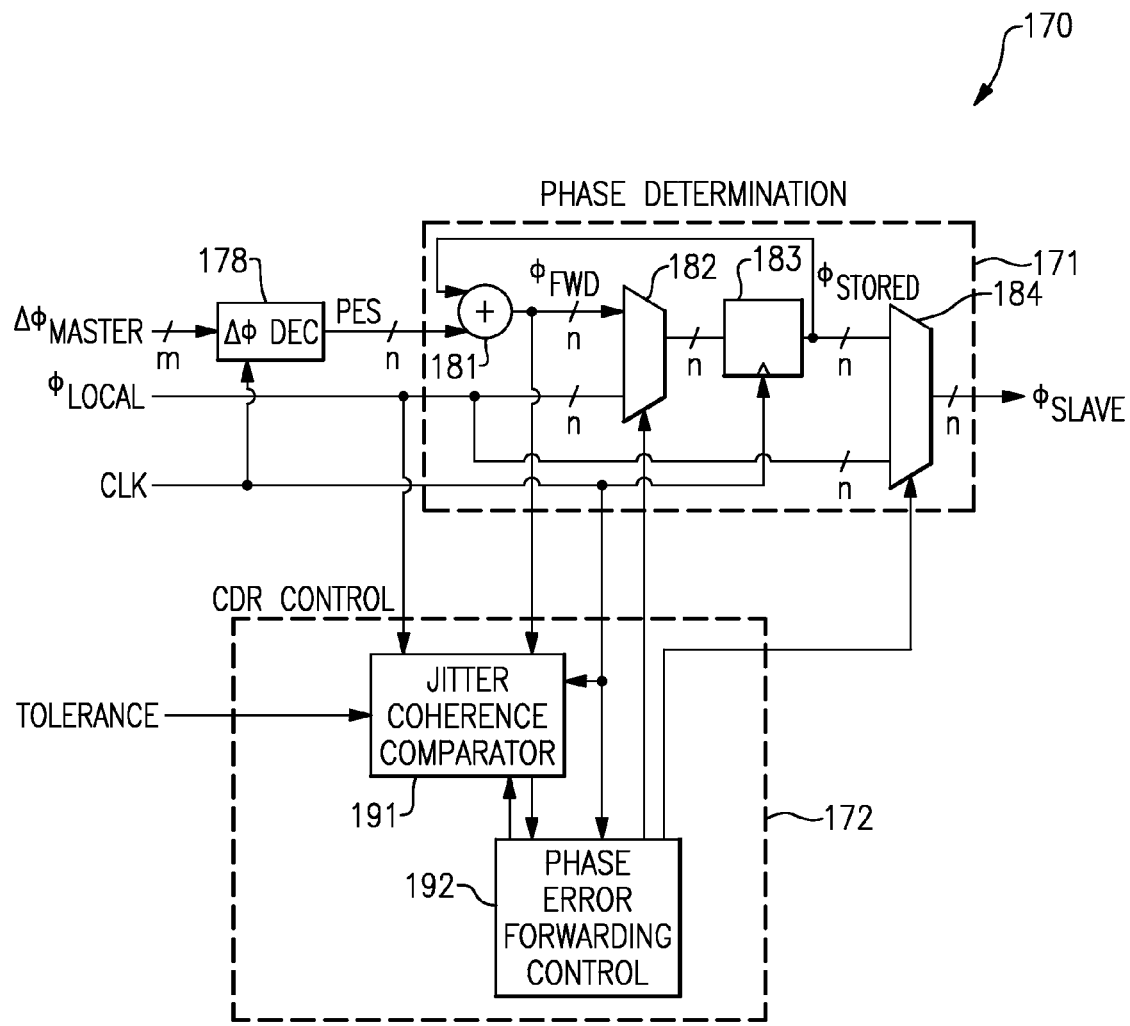
FIG. 7 is a schematic diagram of a portion of a CDR circuit according to another embodiment.

FIG. 7 is a schematic diagram of a CDR sub-circuit 170 according to another embodiment. The illustrated CDR sub-circuit 170 includes a phase difference decoder 178, a phase determination circuit 171, and a CDR control circuit 172. The CDR sub-circuit 170 can represent a portion of a CDR circuit. For example, the phase determination circuit 171 and the CDR control circuit 172 can be included in a phase control circuit, such as the phase control circuit 28 of FIG. 2B or the phase control circuit 38 of FIG. 2C. Additionally, the phase difference decoder 178 illustrates one implementation of a phase difference decoder, such as the phase difference decoder 19 of FIGS. 2B and 2C.

The phase difference decoder 178 receives the master phase error signal $\Delta\phi_{MASTER}$ and a clock signal CLK. Additionally, the phase difference decoder 178 generates a decoded phase error signal PES, which is provided to the phase determination circuit 171. In the illustrated configuration, the master phase error signal $\Delta\phi_{MASTER}$ comprises m bits, and the decoded phase error signal PES comprises n bits. In one embodiment, m is selected to be in the range of 2 bits to 4 bits, and n is selected to be in the range of 2 bits to 3 bits. However, other implementations are possible.

The illustrated phase determination circuit 171 includes an adder 181, a first multiplexer 182, flip-flops 183, and a second multiplexer 184. The adder 181 can be used to add a stored phase signal $\phi_{STORED}$ from the flip-flops 183 and the decoded phase error signal PES to generate a forwarded phase signal $\phi_{FWD}$. The first multiplexer 182 can be used to select between the forwarded phase signal $\phi_{FWD}$ and a local phase signal $\phi_{LOCAL}$ as an input to the flip-flops 183. The second multiplexer 184 can be used to generate the slave phase signal $\phi_{SLAVE}$ by selecting between the stored phase signal $\phi_{STORED}$ and the local phase signal $\phi_{LOCAL}$. In the illustrated configuration, the stored phase signal $\phi_{STORED}$, the forwarded phase signal $\phi_{FWD}$, the local phase signal $\phi_{LOCAL}$, and the slave phase signal $\phi_{SLAVE}$ each comprise n bits.

The illustrated CDR control circuit 172 includes a jitter coherence detection circuit 191 and a phase error forwarding control circuit 192.

The jitter coherence detection circuit 191 receives the local phase signal $\phi_{LOCAL}$, the forwarded phase signal $\phi_{FWD}$, a tolerance signal TOLERANCE, and the clock signal CLK, and provides a jitter coherence signal to the phase error forwarding control circuit 192. The phase error forwarding control circuit 192 controls the selections of the first and second multiplexers 182, 184, and can send or receive one or more signals to or from the jitter coherence detection circuit 191.

The jitter coherence detection circuit 191 can be used to determine whether or not jitter between a first input data stream received by a master CDR circuit and a second input data stream received by a slave CDR circuit is coherent. In the illustrated configuration, the jitter coherency is determined by tracking incoming data in the master CDR circuit and the slave CDR circuit separately, and observing an average phase difference between the local phase signal $\phi_{LOCAL}$ and the forwarded phase signal $\phi_{FWD}$ over q cycles of the clock signal CLK. Additionally, the jitter coherence detection circuit 191 can generate the jitter coherence signal by comparing the average phase difference to the tolerance signal TOLERANCE. For example, when the average phase difference is greater than the tolerance signal TOLERANCE, the jitter can be determined to be incoherent. In one embodiment, q is selected to be in the range of 1,024 clock cycles to 33,554,432 clock cycles.

Additional details of the CDR sub-circuit 170 can be similar to those described earlier.

Figure 8:
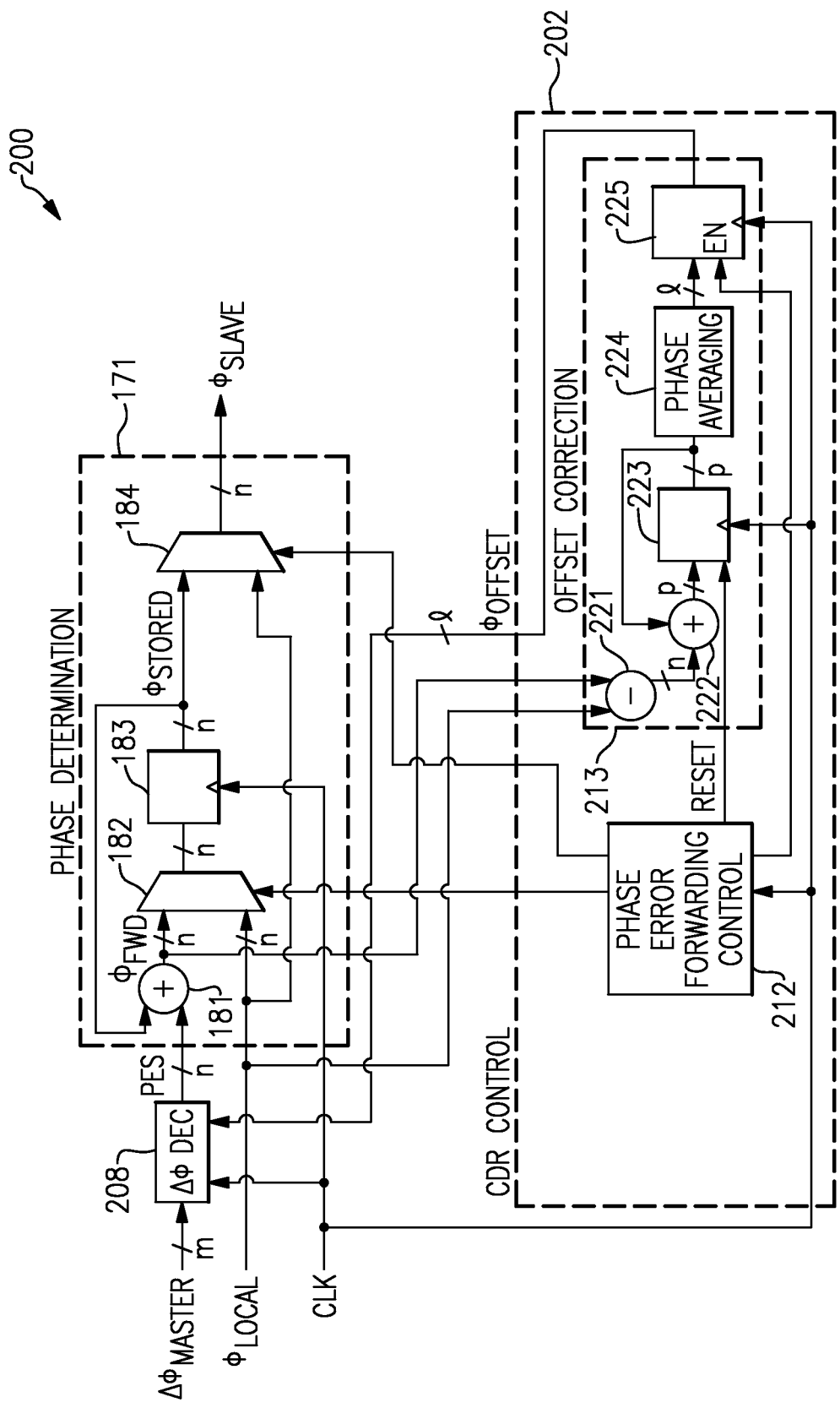
FIG. 8 is a schematic diagram of a portion of a CDR circuit according to another embodiment.

FIG. 8 is a schematic diagram of a CDR sub-circuit 200 according to one embodiment. The illustrated CDR sub-circuit 200 includes a phase difference decoder 208, a phase determination circuit 171, and a CDR control circuit 202. The CDR sub-circuit 200 can represent a portion of a CDR circuit. For example, the phase determination circuit 171 and the CDR control circuit 202 can be included in a phase control circuit, such as the phase control circuit 28 of FIG. 2B or the phase control circuit 38 of FIG. 2C. Additionally, the phase difference decoder 208 illustrates one implementation of a phase difference decoder, such as the phase difference decoder 19 of FIGS. 2B-2C.

The phase difference decoder 208 receives the master phase error signal $\Delta\phi_{MASTER}$, a clock signal CLK, and a phase offset signal $\phi_{OFFSET}$. Additionally, the phase difference decoder provides a decoded phase error signal PES to the phase determination circuit 171, which can be as described earlier. In the illustrated configuration, the phase offset signal $\phi_{OFFSET}$ comprises l bits. In one embodiment, l is selected to be in the range of 3 bits to 4 bits. However, other implementations are possible.

The illustrated CDR control circuit 202 includes a phase error forwarding control circuit 212 and an offset correction circuit 213. The phase error forwarding control circuit 212 receives the clock signal CLK, and generates selection control signals for controlling selections of the first and second multiplexers 182, 184. The phase error forwarding control circuit 212 further generates an enable signal and a reset signal RESET, which can be used in part by the offset correction circuit 213 to generate the phase offset signal $\phi_{OFFSET}$, as will be described below.

The offset correction circuit 213 receives the clock signal CLK, the local phase signal $\phi_{LOCAL}$, the forwarded phase signal $\phi_{FWD}$, the enable signal, the reset signal RESET, and generates the phase offset signal $\phi_{OFFSET}$. The offset correction circuit 213 includes a subtractor 221, an adder 222, a first group of flip-flops 223, a phase averaging circuit 224, and a second group of flip-flops 225. The subtractor 221 can be used to generate an n-bit difference signal based on a difference between the local phase signal $\phi_{LOCAL}$ and the forwarded phase signal $\phi_{FWD}$. The n-bit difference signal can be added to a p-bit output signal from the first group of flip-flops 223, and provided as a p-bit input signal to the first group of flip-flops 223. The p-bit output signal from the first group of flip-flops 223 can be averaged by the phase averaging circuit 224 to generate the phase offset $\phi_{OFFSET}$. In one embodiment, the p is selected to be in the range of 13 bits to 14 bits. However, other implementations are possible.

To calibrate the phase offset $\phi_{OFFSET}$, the phase error forwarding control circuit 212 can initially use the reset signal RESET to reset a state of the first group of flip-flops 223 and the p-bit output signal. Thereafter, the first group of flip-flops 223 can be used to accumulate or integrate a difference between the local phase signal $\phi_{LOCAL}$ and the forwarded phase signal $\phi_{FWD}$ over r cycles of the clock signal CLK. Additionally, the phase averaging circuit 224 can be used to divide the p-bit output signal from the first group of flip-flops 223 by the r cycles to generate an l-bit input signal to second group of flip-flops 225. When enabled by the enable signal from the phase error forwarding control circuit 212, second group of flip-flops 225 can control a value of the phase offset $\phi_{OFFSET}$ based on the l-bit input signal generated by the phase averaging circuit 224. In one embodiment, r is selected to be in the range of 1024 clock cycles to 2048 clock cycles, and l is selected to be in the range of 3 bits to 4 bits. However, other configurations are possible.

Additional details of the CDR sub-circuit 200 can be similar to those described earlier.

Figure 9:
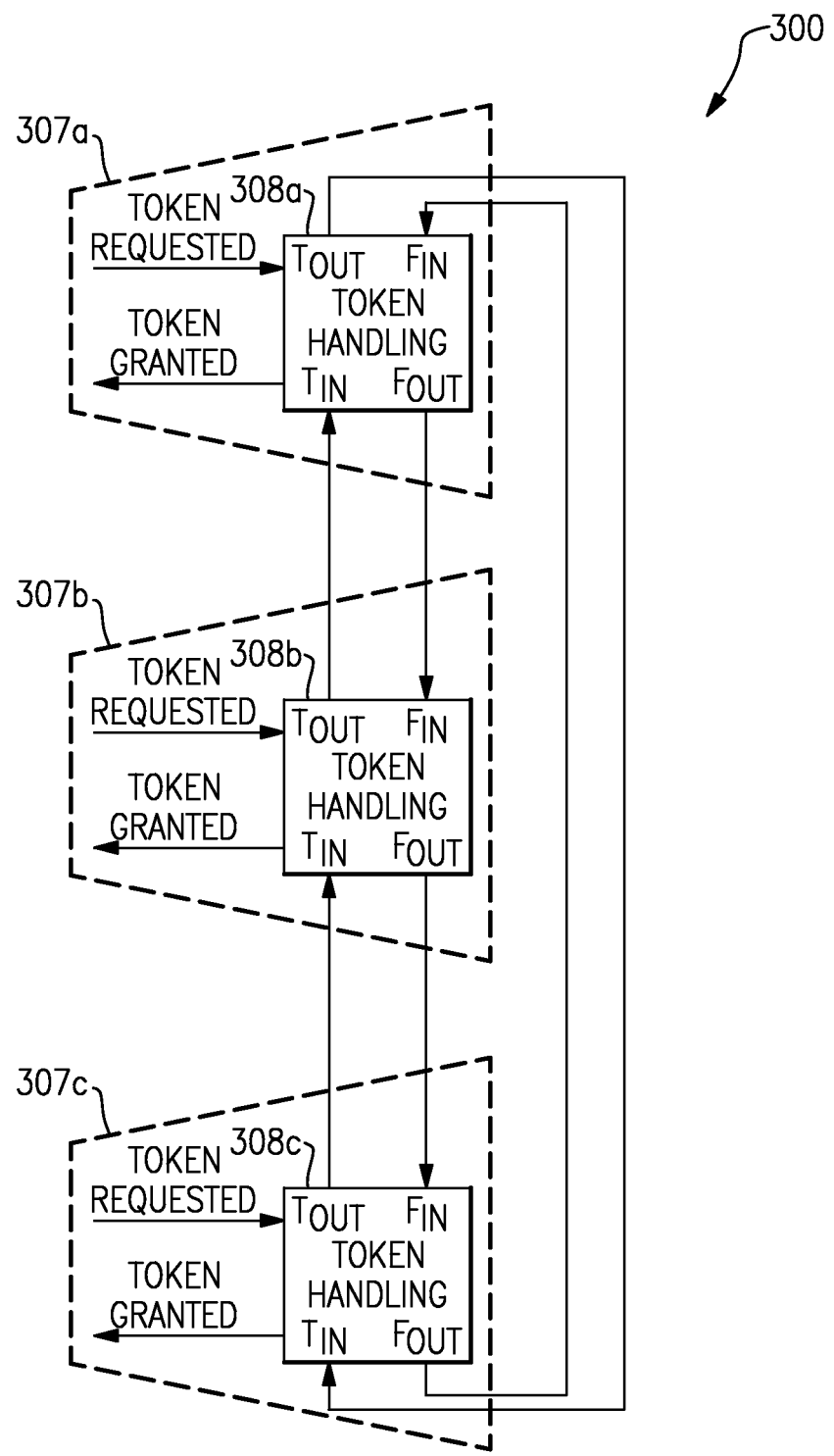
FIG. 9 is a schematic diagram of an electronic system that includes CDR circuits using token passing according to one embodiment.

FIG. 9 is a schematic diagram of an electronic system 300 that includes CDR circuits using token passing according to one embodiment. The illustrated electronic system 300 includes a first CDR circuit 307a, a second CDR circuit 307b, and a third CDR circuit 307c. Although illustrated as including three CDR circuits, the electronic system 300 can be adapted to include more or fewer CDR circuits.

The first CDR circuit 307a includes a first token handling circuit 308a. Additionally, the second CDR circuit 307b includes a second token handling circuit 308b, and the third CDR circuit 307c includes a third token handling circuit 308c.

As shown in FIG. 9, the first token handling circuit 308a includes a token input $T_{IN}$ electrically connected to a token output $T_{OUT}$ of the second token handling circuit 308b. Additionally, the second token handling circuit 308b includes a token input $T_{IN}$ electrically connected to a token output $T_{OUT}$ of the third token handling circuit 308c, and the third token handling circuit 308c includes a token input $T_{IN}$ electrically connected to a token output $T_{OUT}$ of the first token handling circuit 308a. Thus, the token inputs and outputs of the token handling circuits 308a-308c are electrically connected in a ring that can be used to pass a token.

In the illustrated configuration, the first token handling circuit 308a further includes a first feedback input $F_{IN}$ electrically connected to a feedback output $F_{OUT}$ of the third token handling circuit 308c. Additionally, the second token handling circuit 308b includes a feedback input $F_{IN}$ electrically connected to a feedback output $F_{OUT}$ of the first token handling circuit 308a, and the third token handling circuit 308c includes a feedback input $F_{IN}$ electrically connected to a feedback output $F_{OUT}$ of the second token handling circuit 308b. Thus, the feedback inputs and outputs of the token handling circuits 308a-308c can be used to communicate feedback information related to the token. The feedback information provided can include, for example, information indicating whether or not the CDR circuit is ready to accept the token and/or information whether a slave further up the chain has taken the token for themselves.

The illustrated token handling circuits 308a-308c each generate a token requested signal (TOKEN REQUESTED) and a token granted signal (TOKEN GRANTED). In certain configurations, a token handling control circuit can be included in a CDR control circuit (for example, the CDR control circuit 72 of FIG. 5), and the token requested and token received signals can be associated with communications between the token handling circuit and the CDR control circuit's phase error forwarding control circuit (for example, the phase error forwarding control circuit 92 of FIG. 5).

As shown in the FIG. 9, the token is passed in a first or clockwise direction, and feedback information is communicated in a second or counterclockwise direction. However, other configurations are possible, such as implementations in which the token is passed in a counterclockwise direction and feedback information is communicated in a clockwise direction, or implementations including directions that are configurable or selectable.

When the token handling circuit of a particular slave CDR circuit holds the token, the CDR circuit can provide separate phase tracking independent of phase error forwarded from a master CDR circuit. For example, the CDR circuit holding the token can have edge sampling circuitry and DLL circuitry turned on and used to track the CDR circuit's input data stream.

By using a token passing scheme, the electronic system 300 can avoid power supply perturbations associated with activating several slave CDR circuits simultaneously. Thus, the token passing scheme can be used to ensure that one slave CDR circuit turns on at a time.

In certain configurations, the first CDR circuit 307a, the second CDR circuit 307b, and the third CDR circuit 307c operate as slave CDR circuits that receive a master phase error signal from a master CDR circuit that is not shown.

In other configurations the first, second, and third CDR circuits 307a-307c can be individually configurable between a master mode and a slave mode. When a particular CDR circuit is configured in master mode, the CDR circuit's token handling circuit can be configured to pass feedback information from an upstream CDR circuit to a downstream CDR circuit and to pass a token from the downstream CDR circuit to the upstream CDR circuit. Thus, in such a configuration, a CDR circuit operated in the master mode should not hold the token.

Figure 10A:
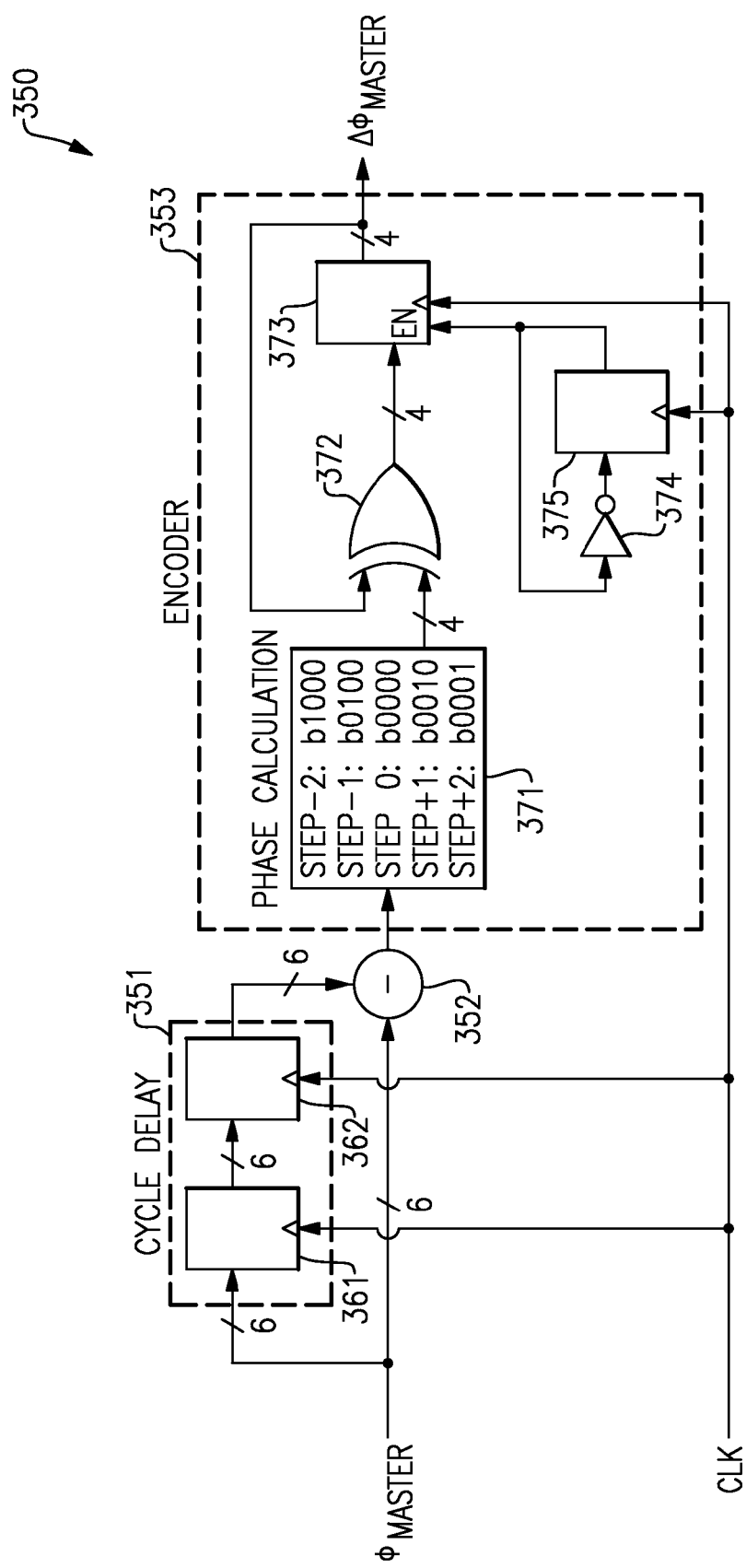
FIG. 10A is a schematic diagram of a phase difference encoder according to another embodiment.

FIG. 10A is a schematic diagram of a phase difference encoder 350 according to another embodiment. The phase difference encoder 350 includes a cycle delay circuit 351, a subtractor 352, and an encoder 353. The illustrated phase difference encoder 350 receives a master phase signal $\phi_{MASTER}$ and a clock signal CLK and generates a master phase error signal $\Delta\phi_{MASTER}$ that is encoded. In the illustrated configuration, the master phase signal $\phi_{MASTER}$ comprises 6 bits and the master phase error signal $\Delta\phi_{MASTER}$ comprises 4 bits. However, other configurations are possible.

The cycle delay circuit 351 includes a first group of flip-flops 361 and a second group of flip-flops 362. The first and second groups of flip-flops can be used to generated a delayed master phase signal by delayed the master phase signal $\phi_{MASTER}$ by two cycles of the clock signal CLK.

The subtractor 352 can generate a phase difference signal based on a difference between the master phase signal $\phi_{MASTER}$ and the delayed master phase signal generated by the cycle delay circuit 351. The phase difference signal corresponds to a change of the master phase signal $\phi_{MASTER}$ between two cycles of the clock signal CLK, and can indicate a change of master phase information over time.

The encoder 353 includes a phase calculation circuit 371, exclusive or (XOR) gates 372, output flip-flops 373, an inverter 374, and an output enable control flip-flop 375.

The phase calculation circuit 371 receives the phase difference signal from the subtractor 352, and generates an encoded signal that is provided as a first input to XOR gates 372. In the illustrated configuration, the encoded signal is generated using one-hot-plus-zero encoding. For example, in the illustrated configuration, the encoded signal has 4 bits, and can have a value corresponding to one of the four possible one-hot states (b1000, b0100, b0010, b0001) or to the all-zero state (b0000). Using one-hot-plus-zero encoding can limit a maximum number of binary "1" values in the encoded signal to one, which permits a phase change to be indicated by an exclusive or operation between the encoded signal and a delayed version thereof. FIG. 10A illustrates one possible code assignment for one-hot-plus-zero encoding of changes to the master phase signal $\phi_{MASTER}$, in which a phase step decrease of two code values is assigned b1000, a phase step decrease of one code value is assigned b0100, no change to the phase step is assigned b0000, a phase step increase of one code value is assigned b0010, and a phase step increase of two code values is assigned b0001. However, other code assignments are possible.

The XOR gates 372 further receive the master phase error signal $\Delta\phi_{MASTER}$ as a second input, and generate an XOR signal that as provided as an input to the output flip-flops 373. The output flip-flops 373 receive the clock signal CLK and an enable signal, and generate the master phase error signal $\Delta\phi_{MASTER}$. The output flip-flops 373 can update or change the value of the master phase error signal $\Delta\phi_{MASTER}$ during cycles of the clock signal CLK in which the enable signal is logically high.

The enable signal is generated by the inverter 374 and the enable control flip-flop 375, which are electrically connected in an inverting digital feedback loop. For example, the input of the enable control flip-flop 375 is electrically connected to an output of the inverter 374 and the output of the enable control flip-flop 375 is electrically connected to an input of the inverter 374. The inverting digital feedback can result in the enable signal generated by the output flip-flops 373 toggling each cycle of the clock signal CLK, thereby resulting in the master phase error signal $\Delta\phi_{MASTER}$ changing once every other clock cycle. Accordingly, the illustrated phase difference encoder 350 encodes the master phase error signal $\Delta\phi_{MASTER}$ to indicate a change to the master phase information between two clock cycles.

In the illustrated configuration, the phase difference encoder 350 encodes the master phase error signal $\Delta\phi_{MASTER}$ such that at most one bit of the master phase error signal $\Delta\phi_{MASTER}$ changes at a time. Encoding the master phase error signal $\Delta\phi_{MASTER}$ in this manner can reduce a number of decoding errors or an impact of decoding errors on operation of a slave CDR circuit that receives the master phase error signal $\Delta\phi_{MASTER}$. For example, the slave CDR circuit can include latches or flip-flops that sample the master phase error signal $\Delta\phi_{MASTER}$, and encoding the master phase error signal $\Delta\phi_{MASTER}$ such that at most one bit is updated at a time can enhance robustness to metastability errors associated with sampling the master phase error signal $\Delta\phi_{MASTER}$ near bit transitions or changes.

The clock signal CLK can have any suitable frequency, such as a frequency selected based on a rate of an input data stream received by a CDR circuit. In one embodiment, the clock signal CLK has a frequency selected to be about $F_{DATA}/N$, where $F_{DATA}$ is the data rate of the input data stream and N is a factor selected to be in the range of 20 to 40. However, other clock signal frequencies are possible.

In the illustrated configuration, the master phase error signal $\Delta\phi_{MASTER}$ can change up to once every other cycle. Thus, certain high frequency changes to the master phase signal $\phi_{MASTER}$ may be filtered by the phase difference encoder 350. For example, when the master phase signal $\phi_{MASTER}$ increases by one step in a first clock cycle but decreases by one step in a second clock cycle, a net step change of the master phase signal $\phi_{MASTER}$ can be zero steps and the master phase error signal $\Delta\phi_{MASTER}$ may not change. Although the high frequency change to the master phase signal $\phi_{MASTER}$ may not be present in the master phase error signal $\Delta\phi_{MASTER}$, such filtering can be beneficial. For example, the illustrated phase difference encoder 350 can filter changes to the master phase signal $\phi_{MASTER}$ associated with a limit cycle oscillation of a master CDR circuit. Thus, any slave CDR circuits operating using phase error forwarding may operate with no limit cycle oscillations or with limit cycle oscillations of smaller magnitude.

However, when the master phase signal $\phi_{MASTER}$ increases by one step in a first clock cycle and increases by another step in a second clock cycle, a net step change of the master phase signal $\phi_{MASTER}$ can be two steps and the master phase error signal $\Delta\phi_{MASTER}$ can indicate a phase change of two steps. Thus, the phase difference encoder 350 can accumulate changes to the master phase error signal $\Delta\phi_{MASTER}$ that occur in the same direction.

Figure 10B:
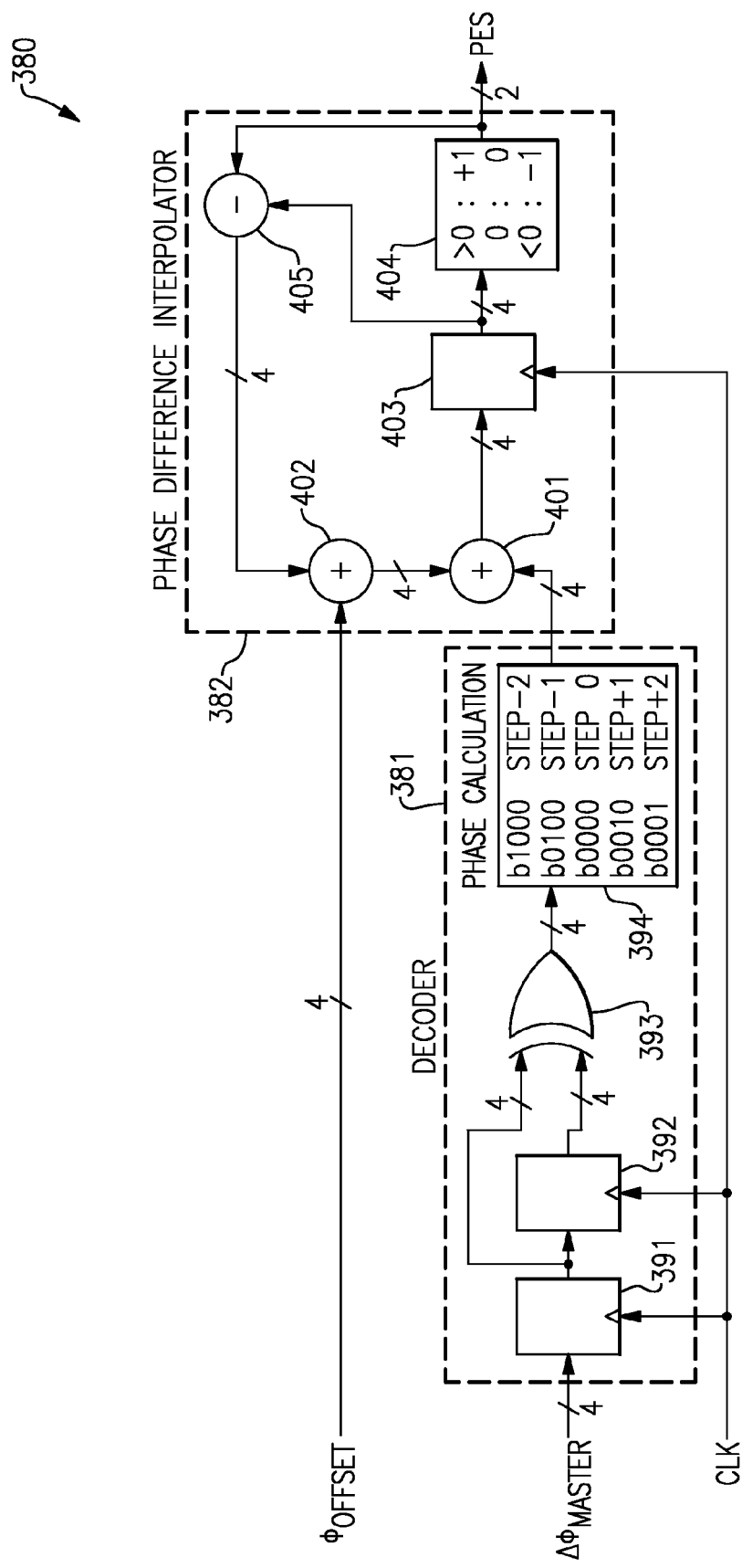
FIG. 10B is a schematic diagram of a phase difference decoder according to another embodiment.

FIG. 10B is a schematic diagram of a phase difference decoder 380 according to another embodiment. The phase difference decoder 380 includes a decoder 381 and a phase difference interpolator 382. The phase difference decoder 380 receives the clock signal CLK, the phase offset signal $\phi_{OFFSET}$, and the master phase error signal $\Delta\phi_{MASTER}$, and generates a decoded phase error signal PES. The phase offset signal $\phi_{OFFSET}$ can be generated by an offset correction circuit of a CDR control circuit. Additionally, the master phase error signal $\Delta\phi_{MASTER}$ can be generated by a phase difference encoder, such as the phase difference encoder 350 of FIG. 10A.

In the illustrated configuration, the master phase error signal $\Delta\phi_{MASTER}$ comprises 4 bits, the phase offset signal $\phi_{OFFSET}$ comprises 4 bits, and the decoded phase error signal PES comprises 2 bits. However, other configurations are possible.

As shown in the FIG. 10B, the decoder 381 receives the clock signal CLK and the master phase error signal $\Delta\phi_{MASTER}$, and can decode the master phase error signal $\Delta\phi_{MASTER}$ to generate a decoded master phase difference signal for the phase difference interpolator 382. The decoder 381 includes a first group of flip-flops 391, a second group of flip-flops 392, XOR gates 393, and a phase calculation circuit 394. The first group of flip-flops 391 can delay the master phase error signal $\Delta\phi_{MASTER}$ by one cycle of the clock signal CLK, and the second group of flip-flops 392 can delay the master phase error signal $\Delta\phi_{MASTER}$ by an additional cycle of the clock signal CLK. As shown in FIG. 10B, the XOR gates 393 can generate an XOR signal based on an exclusive or operation of the outputs of the first and second groups of flip-flops 391, 392. Thus, the XOR signal can correspond to an exclusive or of the master phase error signal $\Delta\phi_{MASTER}$ and a version of the master phase error signal $\Delta\phi_{MASTER}$ delayed by one clock cycle.

The phase calculation circuit 394 can receive the XOR signal, and can decode the XOR signal to generate a decoded phase difference signal for the phase difference interpolator 382. The phase calculation circuit 394 can provide a decoding that is complementary to an encoding provided by the phase calculation circuit 371 of FIG. 10A. For example, in the illustrated configuration, the decoded phase difference signal generated by the phase calculation circuit 394 indicates a phase step decrease of two code values when the XOR signal has value b1000, indicates a phase step decrease of one code value when the XOR signal has value b0100, indicates no change to the phase step when the XOR signal has value b0000, indicates a phase step increase of one code value when the XOR signal has value b0010, and indicates a phase step increase of two code values when the XOR signal has value b0001. However, other code assignments are possible.

The phase difference interpolator 382 receives the decoded master phase difference signal, the phase offset signal $\phi_{OFFSET}$, and the clock signal CLK, and can generate the decoded phase error signal PES by interpolating the decoded master phase difference signal and the phase offset signal $\phi_{OFFSET}$ over multiple cycles of the clock signal CLK. By providing interpolation in this matter, changes to the slave phase signal of a slave CDR circuit can occur more gradually relative to a configuration without interpolation. Thus, the slave CDR circuit can exhibit an enhanced ability to maintain phase-lock in the presence of jitter.

The phase difference interpolator 382 includes a first adder 401, a second adder 402, flip-flops 403, a digital comparator 404, and a subtractor 405. The flip-flops 403 can store a residual phase difference signal corresponding to a phase difference to be interpolated by the phase difference interpolator 382 over multiple clock cycles. The digital comparator 404 can be used to determine whether the residual phase difference signal is greater than zero, less than zero, or equal to zero. Additionally, the decoded phase error signal PES can have a value of +1 when the residual phase difference signal is greater than zero, a value of 0 when the residual phase difference signal is equal to zero, and a value of −1 when the residual phase difference signal is less than zero.

The subtractor 405 can subtract the decoded phase error signal PES from the residual phase difference signal, which can be added to the phase offset signal $\phi_{OFFSET}$ using the second adder 402. In the illustrated configuration, the phase offset signal $\phi_{OFFSET}$ can be provided after a calibration cycle, and can be set to a digital value of 0 thereafter. The first adder 401 adds the output of the second adder 402 to the decoded master phase difference signal generated by the decoder 381. The output of the first adder 401 is provided as an input to the flip-flops 403.

The phase difference interpolator 382 includes a digital feedback loop that controls the decoded phase error signal PES based on an error signal corresponding to the residual phase difference signal stored in the flip-flops 403. Via digital feedback, the value of the decoded phase error signal PES can be controlled on a cycle-by-cycle basis to interpolate the residual phase difference signal across multiple clock cycles.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

APPLICATIONS

Devices employing the above described schemes can be implemented into various electronic devices. Examples of the electronic devices can include, but are not limited to, medical imaging and monitoring, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A clock and data recovery (CDR) system comprising:
   a first CDR circuit configured to receive a first input data stream and to generate a master phase signal based on tracking the first input data stream, wherein the first CDR circuit is further configured to generate a master phase error signal based on a change to the master phase signal over time; and
   a second CDR circuit configured to receive the master phase error signal from the first CDR circuit and a second input data stream, wherein the second CDR circuit is further configured to generate a first slave phase signal based on the master phase error signal and to track the second input data stream based on the first slave phase signal,
   wherein the first CDR circuit further comprises a phase difference encoder configured to generate the master phase error signal by encoding a difference between the master phase signal and a delayed version of the master phase signal.

2. The CDR system of claim 1, wherein the master phase error signal carries a plurality of bits, wherein the phase difference encoder encodes the master phase error signal such that at most one bit of the plurality of bits changes at a time.

3. The CDR system of claim 1, wherein the phase difference encoder comprises:
   a cycle delay circuit configured to generate the delayed version of the master phase error signal by delaying the master phase error signal by at least two cycles of a clock signal;
   a subtractor configured to generate a difference signal based on a difference between the master phase error signal and the delayed version of the master phase error signal; and
   an encoder configured to generate the master phase error signal by encoding the difference signal.

4. The CDR system of claim 3, wherein the encoder is configured to encode the difference signal with one-hot-plus-zero encoding.

5. The CDR system of claim 3, wherein the second CDR circuit comprises a phase difference decoder, wherein the phase difference decoder comprises:
   a decoder configured to generate a decoded master phase difference signal by decoding the master phase error signal; and
   a phase difference interpolator configured to generate a decoded phase error signal based on interpolating the decoded master phase difference signal over two or more cycles of the clock signal,
   wherein the second CDR circuit generates the first slave phase signal based on the decoded phase error signal.

6. The CDR system of claim 1, wherein the second CDR circuit comprises edge tracking circuitry comprising at least one of an edge sampler, a deserializer, or a phase selector, wherein the second CDR circuit is configured to turn off at least a portion of the edge tracking circuitry when the second CDR circuit is tracking the second input data stream using the master phase error signal.

7. The CDR system of claim 1, further comprising three or more CDR circuits including the first and second CDR circuits, wherein at least two of the three or more CDR circuits are configurable between a master mode and a slave mode.

8. The CDR system of claim 1,
wherein the first CDR circuit is configured to capture a first plurality of data samples and a first plurality of edge samples from the first input data stream, wherein the first CDR circuit is further configured to capture the first plurality of data samples with a first data sampling clock signal, wherein the first CDR circuit is further configured to generate the master phase signal based on the first plurality of data samples and the first plurality of edge samples and to control a phase of the first data sampling clock signal based on the master phase signal,
wherein the second CDR circuit is further configured to control a phase of a second data sampling clock signal based on the first slave phase signal and to capture a second plurality of data samples from the second input data stream with the second data sampling clock signal.

9. The CDR system of claim 8, wherein the first CDR circuit comprises:
a data sampler configured to capture the first plurality of data samples from the first input data stream with the first data sampling clock signal;
an edge sampler configured to capture the first plurality of edge samples from the first input data stream with a first edge sampling clock signal;
a phase control circuit configured to generate the master phase error signal based on the first plurality of data samples and the first plurality of edge samples;
a first phase selector configured to control the phase of the first data sampling clock signal based on the master phase error signal; and
a second phase selector configured to control the phase of the first edge sampling clock signal based on the master phase error signal.

10. The CDR system of claim 8, further comprising a third CDR circuit configured to receive a third input data stream,
wherein the third CDR circuit is configured to receive the master phase error signal from the first CDR circuit and to generate a second slave phase signal based on the master phase error signal, wherein the third CDR circuit is further configured to control a phase of a third data sampling clock signal based on the second slave phase signal and to capture a third plurality of data samples from the third input data stream with the third data sampling clock signal.

11. The CDR system of claim 1, wherein the second input data stream carries different symbols than the first input data stream.

12. The CDR system of claim 1, further comprising an integrated circuit (IC) including the first and second CDR circuits.

13. The CDR system of claim 1,
wherein the second CDR circuit further comprises a phase difference decoder configured to decode the master phase error signal to generate a decoded master phase error signal.

14. A method of clock and data recovery (CDR) comprising:
generating a master phase signal based on tracking a first input data stream using a first CDR circuit;
generating a master phase error signal based on a change to the master phase signal over time;
generating a first slave phase signal based on the master phase error signal;
tracking a second input data stream based on the first slave phase signal using a second CDR circuit; and
generating the master phase error signal by encoding a difference between the master phase signal and a delayed version of the master phase signal.

15. The CDR system of claim 1, wherein the second CDR circuit further comprises a means for determining jitter coherence between the first CDR and the second CDR circuit.

16. A clock and data recovery (CDR) system comprising:
a first CDR circuit configured to receive a first input data stream and to generate a master phase signal based on tracking the first input data stream, wherein the first CDR circuit is further configured to generate a master phase error signal based on a change to the master phase signal over time; and
a second CDR circuit configured to receive the master phase error signal from the first CDR circuit and a second input data stream, wherein the second CDR circuit is further configured to generate a first slave phase signal based on the master phase error signal and to track the second input data stream based on the first slave phase signal, wherein the second CDR circuit comprises:
a phase control circuit configured to generate the first slave phase signal, wherein the phase control circuit comprises:
an accumulator configured to generate a local phase signal; and
a phase determination circuit configured to generate a forwarded phase signal by adjusting a stored phase signal based on the master phase error signal.

17. The CDR system of claim 16, wherein the phase control circuit further comprises:
a jitter coherence detection circuit configured to generate a jitter coherence signal based on comparing the forwarded phase signal to the local phase signal, wherein the jitter coherence signal indicates whether a jitter between the first input data stream and the second input data stream is coherent or incoherent,
wherein the phase control circuit is configured to generate the first slave phase signal using the local phase signal when the jitter coherence signal indicates that the jitter is incoherent.

18. The CDR system of claim 17, wherein the jitter coherence detection circuit generates the jitter coherence signal by comparing an average difference between the forwarded phase signal and the local phase signal phase over a plurality of clock cycles to a tolerance signal.

19. The CDR system of claim 16, wherein the phase control circuit further comprises:
an offset correction circuit configured to generate a phase offset signal based comparing the forwarded phase signal to the local phase signal.

20. The CDR system of claim 19, wherein the offset correction circuit is configured to regularly calibrate the phase offset signal to compensate for a phase drift between the master phase signal and the first slave phase signal.

21. The CDR system of claim 20, further comprising two or more slave CDR circuits including the second CDR circuit, wherein the two or more slave CDR circuits are configured to pass or receive a token between one another over a ring token interface, wherein the phase control circuit further comprises a token handling circuit configured to pass or receive the token, wherein the offset correction circuit calibrates the phase offset signal when the token handling circuit holds the token.

22. The CDR system of claim 19, further comprising:
a phase difference decoder configured to receive the master phase error signal and to generate a decoded phase error signal, wherein the phase determination circuit generates the forwarded phase signal based on adding the stored phase signal and the decoded phase error signal, wherein the phase difference decoder receives the phase offset signal and generates the decoded phase error signal in part by interpolating the phase offset signal over a plurality of cycles of a clock signal.

23. The CDR system of claim 19, wherein the offset correction circuit generates the phase offset signal based on an average phase difference between the forwarded phase signal and the local phase signal phase over a plurality of cycles of a clock signal.

24. A clock and data recovery (CDR) system comprising:
a first CDR circuit configured to receive a first input data stream and to generate a master phase signal based on tracking the first input data stream, wherein the first CDR circuit is further configured to generate a master phase error signal based on a change to the master phase signal over time;
a second CDR circuit configured to receive the master phase error signal from the first CDR circuit and a second input data stream, wherein the second CDR circuit is further configured to generate a first slave phase signal based on the master phase error signal and to track the second input data stream based on the first slave phase signal; and
two or more slave CDR circuits including the second CDR circuit, wherein the two or more slave CDR circuits are configured to pass or receive a token between one another over a ring token interface, wherein each slave CDR circuit of the two or more slave CDR circuits is configured to update a local phase offset relative to the master phase signal when the slave CDR circuit holds the token.

25. The method of claim 14, further comprising:
receiving, at the second CDR circuit, the master phase error signal; and
decoding the master phase error signal using a phase difference decoder of the second CDR circuit to generate a decoded master phase signal.

26. The method of claim 14, wherein the master phase error signal carries a plurality of bits, wherein the method further comprises encoding the master phase error signal such that at most one bit of the plurality of bits changes at a time.

27. The method of claim 14, further comprising:
generating the delayed version of the master phase signal based on delaying the master phase signal by at least two cycles of a clock signal;
decoding the master phase error signal to generate a decoded master phase signal;

interpolating the decoded master phase signal over two or more cycles of the clock signal to generate a decoded phase error signal; and
generating the first slave phase signal based on the decoded phase error signal.

28. The method of claim 14, further comprising:
capturing a first plurality of data samples and a first plurality of edge samples from the first input data stream using a first data sampling clock signal;
generating the master phase signal based on the first plurality of data samples and the first plurality of edge samples;
controlling a phase of the first data sampling clock signal based on the master phase signal;
controlling a phase of a second data sampling clock signal based on the first slave phase signal; and
capturing a second plurality of data samples from a second input data stream using a second CDR circuit, wherein the second plurality of data samples are captured using the second data sampling clock signal.

29. The method of claim 28, further comprising:
capturing a second plurality of edge samples from the second input data stream using the second CDR circuit;
generating a local phase signal based on the second plurality of data samples and the second plurality of edge samples using the second CDR circuit;
generating a forwarded phase signal using the master phase error signal and a stored phase signal;
determining whether a jitter between the first input data stream and the second input data stream is coherent or incoherent based on comparing the forwarded phase signal and the local phase signal; and
tracking the first input data stream and the second input data stream using separate phase information when the jitter is incoherent.

30. The method of claim 28, further comprising:
capturing a second plurality of edge samples from the second input data stream using the second CDR circuit;
generating a local phase signal based on the second plurality of data samples and the second plurality of edge samples using the second CDR circuit;
generating a forwarded phase signal using the master phase error signal and a stored phase signal; and
generating a phase offset signal based on comparing the forwarded phase signal and the local phase signal.

31. A method of clock and data recovery (CDR) comprising:
generating a master phase signal based on tracking a first input data stream using a first CDR circuit;
generating a master phase error signal based on a change to the master phase signal over time;
generating a first slave phase signal based on the master phase error signal;
tracking a second input data stream based on the first slave phase signal using a second CDR circuit;
receiving a token as an input to a token handling circuit of the second CDR circuit; and
calibrating a local phase offset of the first slave phase signal relative to the master phase signal when the second CDR circuit holds the token.

* * * * *